United States Patent
Lopez et al.

(10) Patent No.: US 11,631,715 B2
(45) Date of Patent: Apr. 18, 2023

(54) MONOLITHIC MULTI-COLOR MATRIX EMITTER WITH PATTERNED PHOSPHOR LAYER

(71) Applicant: Lumileds LLC, San Jose, CA (US)

(72) Inventors: Toni Lopez, Vaals (NL); Marcel Rene Bohmer, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 121 days.

(21) Appl. No.: 17/199,171

(22) Filed: Mar. 11, 2021

(65) Prior Publication Data

US 2022/0293667 A1 Sep. 15, 2022

(51) Int. Cl.
| | |
|---|---|
| H01L 27/15 | (2006.01) |
| H05B 45/20 | (2020.01) |
| H01L 33/44 | (2010.01) |
| H01L 25/075 | (2006.01) |

(52) U.S. Cl.
CPC ........ *H01L 27/156* (2013.01); *H01L 25/0753* (2013.01); *H01L 33/44* (2013.01); *H05B 45/20* (2020.01)

(58) Field of Classification Search
CPC ... H01L 27/156; H01L 25/0753; H01L 33/44; H05B 45/20
See application file for complete search history.

(56) References Cited

U.S. PATENT DOCUMENTS

| | | | |
|---|---|---|---|
| 2006/0181192 A1 | 8/2006 | Radkov et al. | |
| 2009/0140633 A1* | 6/2009 | Tanimoto | H04N 9/315 313/503 |
| 2010/0129525 A1* | 5/2010 | Shida | H05B 33/10 118/712 |
| 2010/0315012 A1 | 12/2010 | Kim et al. | |
| 2012/0057338 A1 | 3/2012 | Mitsuishi et al. | |
| 2018/0090470 A1 | 3/2018 | Miwa et al. | |
| 2018/0090646 A1* | 3/2018 | Kato | H01L 33/504 |
| 2018/0190880 A1 | 7/2018 | Vampola et al. | |
| 2019/0195466 A1* | 6/2019 | Shimizu | H01L 33/505 |
| 2019/0198727 A1* | 6/2019 | Shen | H01L 33/62 |
| 2019/0198732 A1 | 6/2019 | Shimizu et al. | |
| 2019/0244937 A1* | 8/2019 | Honjo | H01L 25/0753 |
| 2021/0020806 A1* | 1/2021 | Dimitropoulos | H01L 33/20 |

FOREIGN PATENT DOCUMENTS

| | | |
|---|---|---|
| JP | 2007173397 A | 7/2007 |
| WO | 2018/114527 A1 | 6/2018 |

OTHER PUBLICATIONS

From KIPO as the ISA, Notification of Transmittal of the International Search Report and the Written Opinion of the International Searching Authority, or the Declaration, PCT/US2022/019316, dated Jun. 23, 2022, 10 pages.

* cited by examiner

*Primary Examiner* — Tracie Y Green

(57) ABSTRACT

A lighting device is disclosed that includes a plurality of light emitting diodes arranged in an array, a plurality of trenches disposed between and optically isolating the light emitting diodes, and a patterned converter layer disposed over an array surface formed by light emitting surfaces of the light emitting diodes and upper surfaces of the trenches, the patterned converter layers including a first region having a first converter and a second region having a second converter different from the first converter, the first region and second region disposed over different areas of the array surface.

19 Claims, 22 Drawing Sheets

900

MONOLITHIC MULTI-COLOR MATRIX EMITTER WITH PATTERNED PHOSPHOR LAYER

FIELD OF THE INVENTION

The disclosure relates generally to phosphor-converted lighting devices, and more particularly to lighting devices having a patterned phosphor-converter layer with two or more colors on arrays and micro-arrays of light emitting diodes, and methods of forming the patterned phosphor-converter layer.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

SUMMARY

In one aspect, a lighting device is disclosed that includes a plurality of light emitting diodes arranged in an array, a plurality of trenches disposed between and optically isolating the light emitting diodes, and a patterned converter layer disposed over an array surface formed by light emitting surfaces of the light emitting diodes and upper surfaces of the trenches, the patterned converter layers including a first region having a first converter and a second region having a second converter different from the first converter, the first region and second region disposed over different areas of the array surface. The first region may be disposed over the light emitting surfaces and the second region is disposed over the trenches. The first converter may be a phosphor that converts light emitted from the light emitting diode structures to a warm white color and the second converter is a phosphor that converts the light emitted from the light emitting diode structures to a cooler white color than the first converter. An area of the first region is smaller than an area of the light emitting surface and the second region covers the trenches and portions of the edges of the light emitting surfaces. The light emitting surfaces may have an area that is less than 500 µm by 500 µm, the first converter and second converter may be formed in an alternating pattern over each adjacent light emitting surface, and each light emitting diode structure may be individually addressable. The first converter may emit a warm white light and the second converter may emit a cool white. The first converter may emit a white light and the second converter may emit a colored light.

In another aspect, a lighting device is disclosed that includes a plurality of light emitting diodes arranged in an array, each light emitting diode including a light emitting surface; and a patterned converter layer disposed over the light emitting surfaces of the light emitting diodes, the patterned converter layers including a first region having a first converter and a second region having a second converter different from the first converter, and at least one first region and at least one second region is disposed over each light emitting surface. The lighting device of may further include a first electrical contact configured to activate light emission from a first portion of the light emitting surface and a second electrical contact configured to activate light emission from a second portion of the light emitting surface. The first region of the converter layer may be disposed over the first portion of the light emitting surface and the second region of the converter layer may be disposed over the second portion of the light emitting surface. The first portion may be a first half of the light emitting surface and the second portion may be a second half of the light emitting surface adjacent to the first half. The first portion may include a first quarter of the light emitting surface and a second quarter of the light emitting surface in an opposite corner from the first quarter, and the second portion may include a third quarter of the light emitting surface and a fourth quarter of the light emitting surface in another opposite corner of from the third quarter and adjacent the second quarter. The lighting device may include a circuit driver including a mixer connected to the first electrical contact and the second electrical contact, the mixer configured to receive an input voltage and an input duty cycle, and to apportion the input voltage between the first electrical contact and the second electrical contact based on the input duty cycle. The first converter may be a phosphor that converts light emitted from the light emitting diode structures to a warm white color and the second converter may be a phosphor that converts the light emitted from the light emitting diode structures to a cooler white color than the first converter.

In yet another aspect, a lighting device is disclosed that includes a plurality of light emitting diodes, each light emitting diode including a light emitting surface, a plurality of first electrical contacts each electrically connected one of the light emitting diodes and configured to activate light emission from a first portion of each of the light emitting diode, a plurality of second electrical contacts each electrically connected to one of the light emitting diodes and configured to activate light emission from a second portion of each of the light emitting diode, and a patterned converter layer disposed over the light emitting surfaces of the light emitting diodes, the patterned converter layers including a plurality of first regions having a first converter and disposed over the first portions of the light emitting diodes, and a plurality of second regions having a second converter different from the first converter and disposed over the second portion of the light emitting diodes. The first portions may be ¾ of the light emitting surface of each light emitting diode and second portions may be a remaining ¼ of the light emitting surface of each light emitting diode. For two adjacent light emitting diodes of the plurality of light emitting diodes, the second portions may be adjacent and the second converter regions may cover a portion of a trench formed between the two adjacent light emitting diodes. For four adjacent light emitting diodes of the plurality of light emitting diodes, the second portions may be adjacent and the second converter regions may cover a portion of trenches formed between the four adjacent light emitting diodes. The lighting device may further include a circuit driver including a mixer connected to the first electrical contact and the second electrical contact, the mixer configured to receive an input voltage and an input duty cycle, and to apportion the input voltage between the first electrical contact and the second electrical contact based on the input duty cycle. The first converter may be a phosphor that converts light emitted from the light emitting diode structures to a warm white color and the second converter may be a phosphor that converts the light emitted from the light emitting diode structures to a cooler white color than the first converter.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
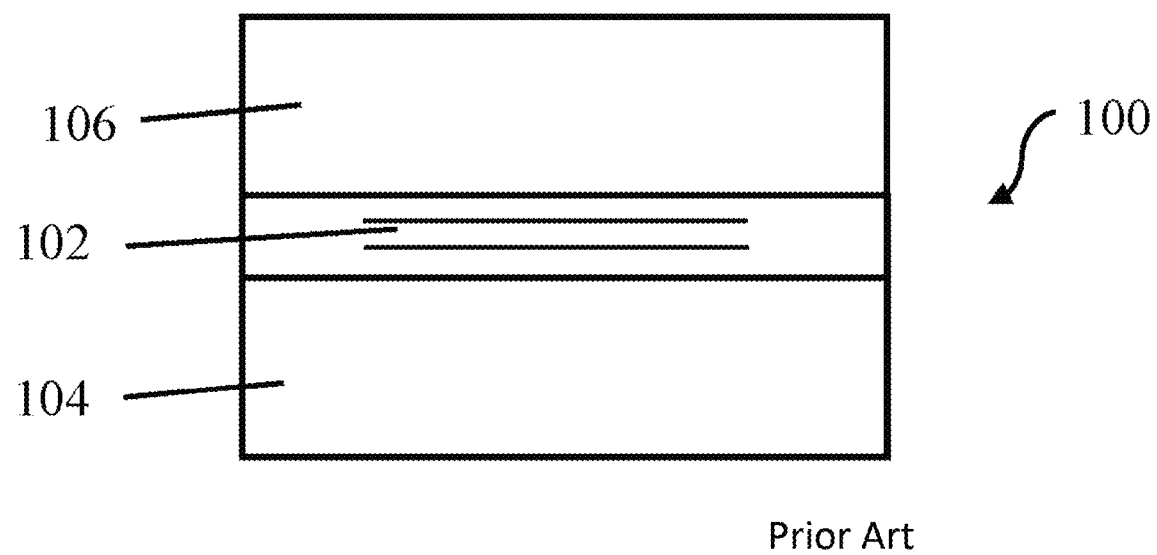
FIG. 1 shows a schematic cross-sectional view of an example pcLED.

FIG. 1 shows an example of an individual pcLED 100 comprising a light emitting semiconductor diode structure 102 disposed on a substrate 104, together considered herein an "LED", and a converter layer 106 disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

The converter layer 106 includes a converter material, such as a phosphor, an organic dye, or a quantum dot, that downconverter light emitted by the LED. Choice of converter material depends on the desired optical output from the pcLED.

Figure 2A:
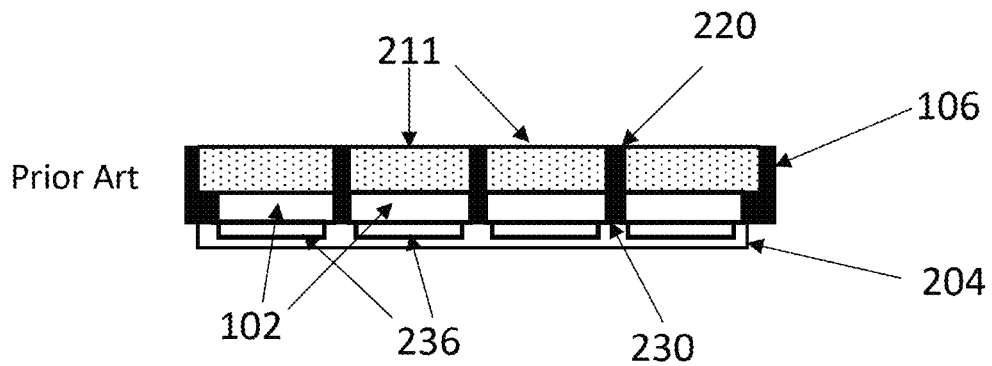
FIGS. 2A and 2B show, respectively, cross-sectional and top schematic views of an array of pcLEDs.
Figure 2B:
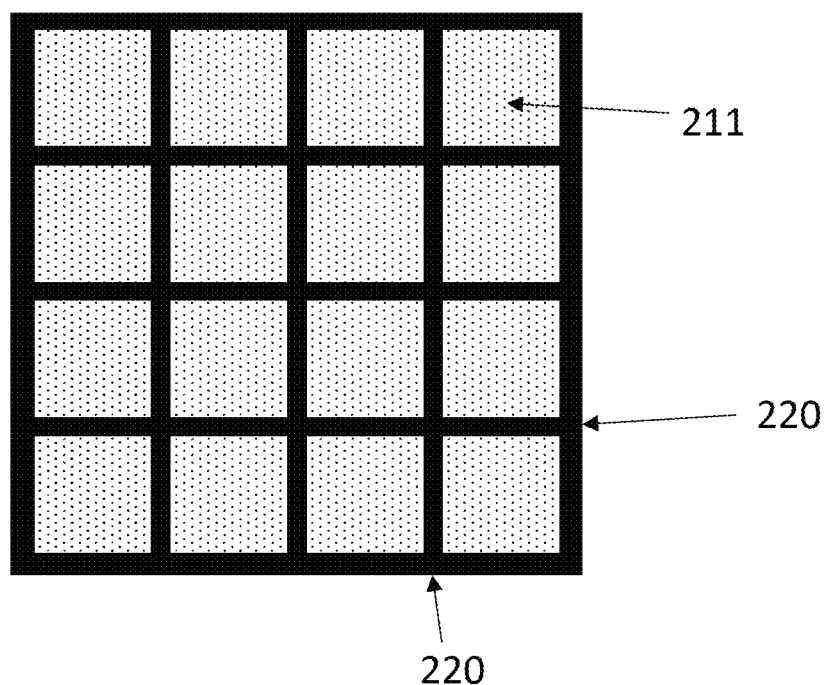

FIGS. 2A and 2B illustrate, respectively, a cross-sectional and a top view of a matrix, or an array, of pcLEDs.

Array 200 of FIGS. 2A and 2B includes converter layer 106 which is formed of a plurality of converter layer pixel 211. Converter layer pixels 211 are separated by a grid of optical isolation barriers 220 between the converter layer pixels 211. The optical isolation barriers 220 may be extensions of trenches 230 separating the LEDs. Such optical isolation barriers 220 can allow for the segmented converter layer 106 to have infinite contrast between neighboring pixels. Converter layer 106 covers a plurality of individual light emitting diode structures 102, which will be described in more detail below with respect to FIG. 2C, and contacts 236 for electrically connecting each light emitting diode structure 102. Contacts 236 and light emitting diode structures 102 may be situated on a substrate 204.

Such an array 200 may include any suitable number of pcLEDs arranged in any suitable manner. In the illustrated example the array is depicted as formed monolithically on a shared substrate, but alternatively an array of pcLEDs may be formed from separate individual pcLEDs. Substrate 204 may optionally comprise CMOS circuitry for driving the LED, and may be formed from any suitable materials.

Although FIGS. 2A and 2B, show a four by four array of sixteen pcLEDs, such arrays may include for example tens, hundreds, or thousands of LEDs. Individual LEDs may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by trenches, sometimes referred to as streets or lanes, 230 having a width in the plane of the array of, for example, hundreds of microns, less than or equal to 100 microns, less than or equal to 50 microns, less than or equal to 10 microns, or less than or equal to 5 microns. Although the illustrated examples show rectangular pixels arranged in a symmetric matrix, the pixels and the array may have any suitable shape.

LEDs having dimensions in the plane of the array (e.g., side lengths) of less than or equal to about 50 microns are typically referred to as microLEDs, and an array of such microLEDs may be referred to as a microLED array.

Figure 2C:
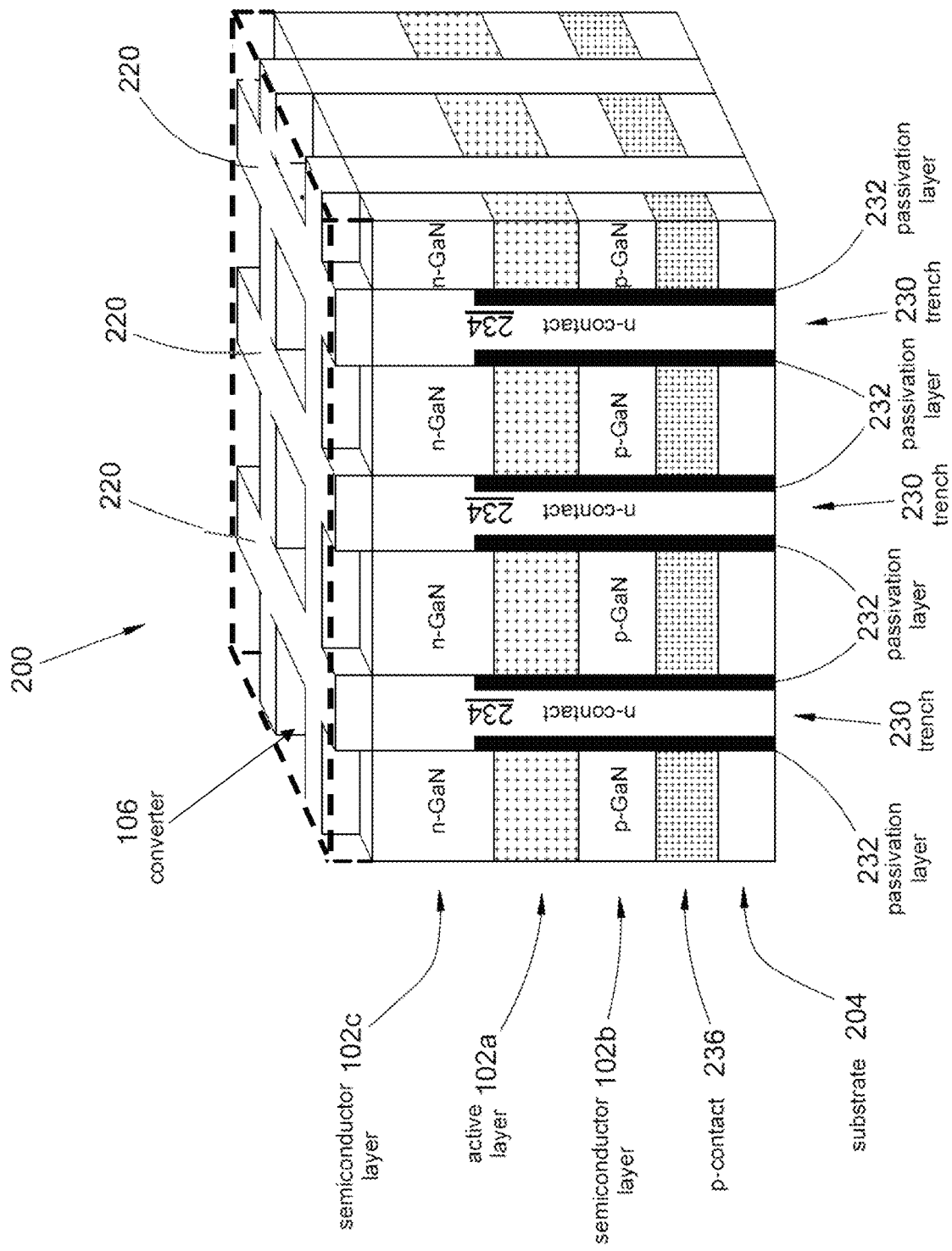
FIG. 2C shows a perspective view of several LEDs of an example pc miniLED or pc microLED array monolithically formed on a substrate.

An array of LEDs, or portions of such an array, may be formed as a segmented monolithic structure in which individual LED pixels are electrically isolated from each other by trenches and/or insulating material, but the electrically isolated segments remain physically connected to each other by portions of the semiconductor structure. FIG. 2C shows a perspective view of an example of such a segmented monolithic LED structure, which may be used to form an array such as array 200. Individual semiconductor LED devices 102 in array 200 are separated by trenches 230 which are filled to form n contacts 234. The monolithic structure is grown or disposed on the substrate 204. Each pixel includes a p contact 236, a p GaN semiconductor layer 102*b*, an active region 102*a*, and an n GaN semiconductor layer 102*c*; the layers 102*a*/102*b*/102*c* collectively form the semiconductor LED 102. A converter layer 106 may be deposited on the semiconductor layer 102*c* (or other applicable intervening layer). Passivation layers 232 may be formed within the trenches 230 to separate at least a portion of the n contacts 234 from one or more layers of the semiconductor. The n contacts 234, other material within the trenches 230, or material different from material within the trenches 230 may extend into the converter layer 106 to form complete or partial optical isolation barriers 220 between the pixels, as described above.

The individual LEDs in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. Such light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Figure 3A:
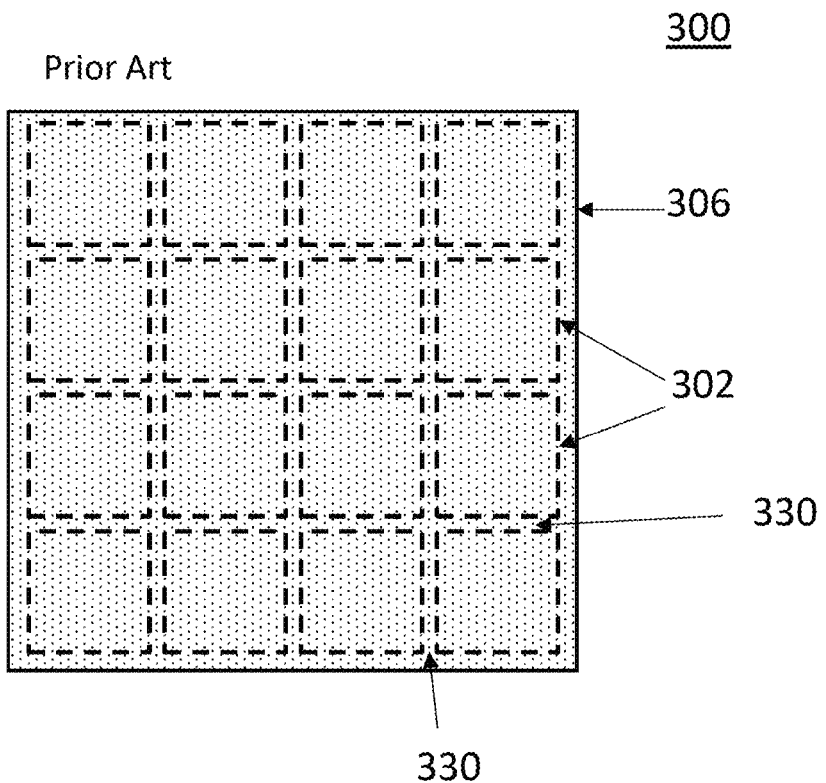
FIGS. 3A and 3B illustrate, respectively, a top schematic view and cross-sectional view of another example of a matrix or array of pcLEDs.
Figure 3B:
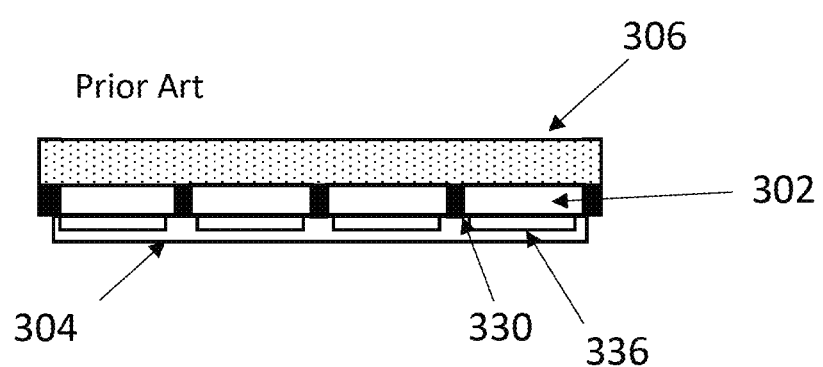

FIGS. 3A and 3B illustrate, respectively, a top view and cross-sectional view of another example of a matrix or array of pcLEDs.

Array 300 of FIGS. 3A and 3B includes a plurality of individual light emitting diode structures 302 and contacts 336 for electrically connecting to each light emitting diode structure 302. Contacts 336 and light emitting diode structures 302 may be situated on a substrate 304. Each light emitting diode 302 is separated by trenches 330. The structure of the light emitting diodes 302, contacts 336 and trenches 330 may be the same as those described with respect to FIG. 2C. In array 300, however, the converter layer 306 is not segmented by optical barriers, but forms a single blanket layer over the LEDs. In top view FIG. 3A, the dashed boxes represent the light emitting diodes disposed underneath the blanket converter layer 306.

Disclosed herein are light emitting devices which have a converter layer that includes a pattern of two different converter materials on the same plane disposed on multipixel array light emitting diodes, such as that illustrated above in FIG. 2C, in which each individual pixel is addressable, and methods for forming such patterned converter layers. Lighting devices with such patterned, multi-color converter layer on arrays of LEDs can be used to solve various problems with current state of the art lighting devices, as disclosed herein.

In current state of the art light emitting arrays, the converter layer 106 and 306 are formed of a single color of converter material. That is, the same color converter material, such as a same color of phosphor, is used in each of the converter layer pixels 211 in arrays such as array 200, and the blanket layer converter 306 as shown in array 300 is also a single color of converter material.

Both arrays 200, 300 have problems with providing a uniform light source. Both arrays 200 and 300 have trenches 230, 330 between each light emitting diode 102, 302 that optically isolate the light emitters. In array 200, the optical isolation barriers 220 further isolate emitted light. This optical isolation results in dark gaps, which may appear as grid lines, being visible in the light projected from the arrays 200, 300. In the case of array 300 which has the blanket converter layer 306 without the optical isolation barriers 220, the dark gaps may appear less dark than from array 300, but the trenches 330 separating the light emitting diodes 302 still reduce the uniformity of the projected light from array 300. Conventionally, to remove these dark gaps from the projected light, a diffuser or system level lenses must be added to the device to compensate for the lines.

Another cause of non-uniform projected light from arrays 200, 300 is color over angle and color over source variation in the color of the light emitted. That is, some of the light emitted from the light emitter 102, 302 travels in a direction perpendicular, or mostly perpendicular, to the surface of the light emitter and goes directly through the converter layer. On the other hand, some of the light emitted from the light emitter 102, 302 travels more laterally through the layer before exiting the converter layer. The laterally traveling light has a greater optical pathway, and therefore may be more downconverted and "warmer" than the light emitted more perpendicularly to the light emitting surface of the LEDs. These differences in light path can cause color over angle and color over source variations in the light projected from the arrays 200, 300. Conventionally, color mixing to achieve a uniform appearance of the light is achieved by using secondary optics including diffusers.

Patterned converter layers, that include two or more different converters disposed on arrays of individually addressable LEDs in a pattern, can be used to improve the appearance of light projected from light emitting device, in particular the uniformity of the light.

Figure 4A:
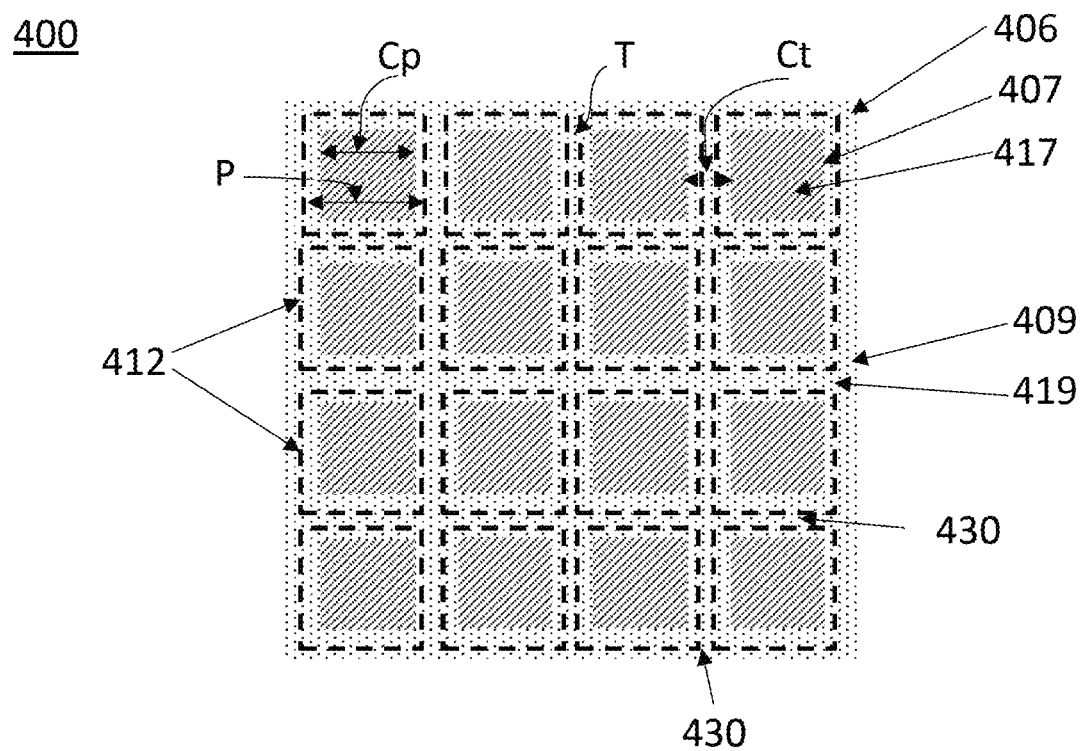
FIGS. 4A, 4B, and 4C illustrate, respectively, a top schematic, cross-sectional, and expanded cross-sectional view of a lighting device with a patterned converter layer over an array of light emitting diode structures as disclosed herein.
Figure 4B:
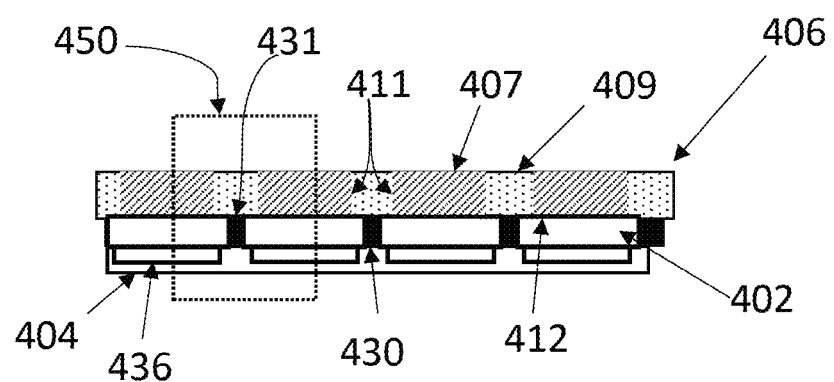
Figure 4C:
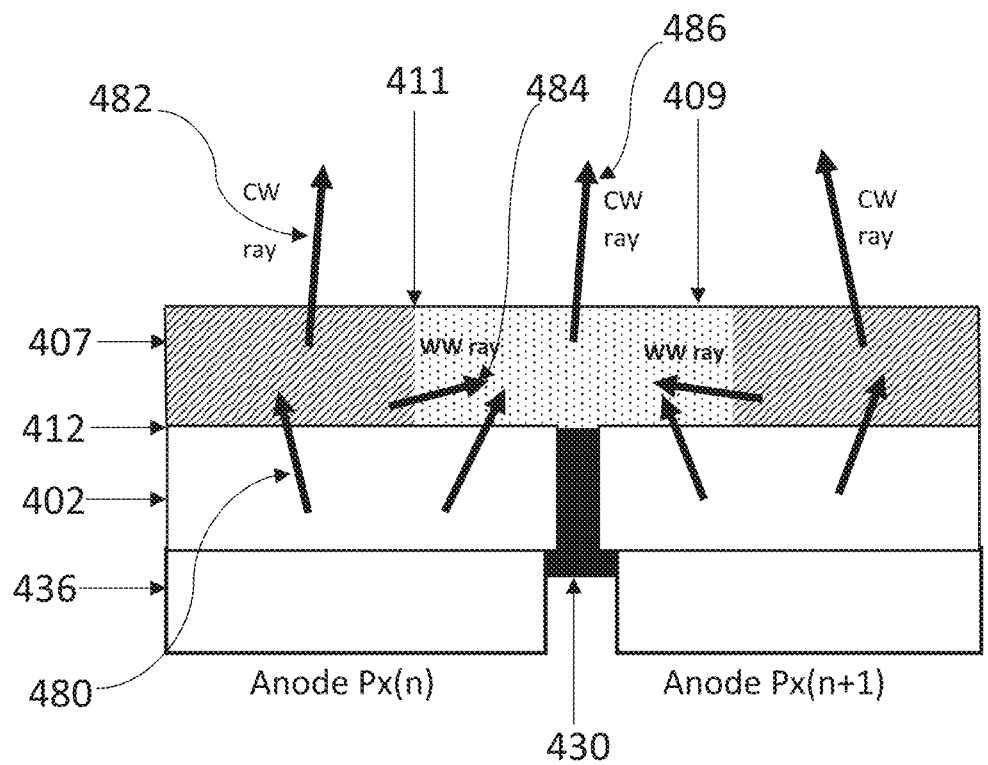

FIGS. 4A, 4B, and 4C illustrate, respectively, a top, cross-sectional, and expanded cross-sectional view of a pcLED array which has improved uniformity in the light projected, and thus may be used without additional diffusers and lenses to remove dark gaps, color over angle, and color over source variations in the projected light. This is achieved by using a pattern of two differently colored converters within the converter layer.

Array 400 of FIGS. 4A, 4B, and 4C includes a plurality of individual light emitting diode structures 402 and contacts 436 for electrically connecting to each light emitting diode structure 402. Contacts 436 and light emitting diode 402 may be situated on a substrate 404. Each light emitting diode 402 is separated by trenches 430. The structure of the light emitting diodes 402, contacts 436 and trenches 430 may be similar those described with respect to FIG. 2C. In array 400, however, the upper surfaces 431 of the trenches 430 align, or substantially align, with the upper surface of the light emitting diodes 402, so that the surface is flat, or substantially flat, and there are no optical isolation barriers protruding into converter layer 406.

Converter layer 406 of array 400 has first sections, or regions, 407 that are formed with a first converter 417, and a second region 409 that is formed with a second converter 419 different than the first converter 417. For example, the first converter 417 may be a phosphor or phosphor combination emitting a warm white color, and the second converter 419 may be a phosphor or phosphor combination emitting a cool white color.

Both first regions 407 and second region 409 are formed in the same blanket layer 406, in the same plane. Viewing FIG. 4A, the squares marked in dashed lines represent the light emitting areas 412 of the light emitting diodes 402 underneath the converter layer 406, and the grid between the light emitting areas 412 indicate the location of the trenches 430. The first regions 407 and second regions 409 form a grid pattern, with the first regions 407 patterned into squares and surrounded by second region 409 formed in a pattern around those squares.

The squares of first regions 407 are positioned over the light emitting areas 412 of light emitting diodes 402 and the grid pattern of the second region 409 is positioned over the trenches 430.

In one example, as shown in FIGS. 4A-4C, the area of each individual square of the first regions 407 in the converter layer 406 may smaller than the area of the light emitting area 412 of light emitting diode 402 over which it is positioned. In such case, the width of the grid pattern of second region 409 of converter layer 406 is wider than the width of the trenches 430, and the second region 409 also covers edges of the light emitting area 412 of light emitting diodes 402. In particular, viewing FIG. 4A, the width P represents the width of the light emitting area 412 of light emitting diode 402, and the width T represents the width of the trench 430. The width Cp represents the width of the square of first regions 407 having first converter 417, and the width Ct represents the width of the second region 409 having second converter 419 between the first regions 407. FIG. 4A illustrates a converter layer 406 width Cp that is smaller than width P, and width Ct that is greater than width T. In general, the area of the first regions 407 may be 80% to 95% of the area of the light emitting surface 412 of the light emitting diode 402 over which it is positioned. Such pattern has the advantages of improving color correction and compensating for misalignment in the process of forming the converter layer 406. However, other patterns, in which the area of first regions 407 are substantially identical to, or larger than, light emitting area 412 may be used, depending on the application.

As shown in FIG. 4B, the first regions 407 and second region 409 are formed within the same layer in a single plane, and meet at junctions 411 without the use of an optical barrier. FIG. 4B illustrates junctions 411 aligning over the light emitting area of light emitting diode 402, but as noted above, the junctions may align with the edges of the light emitting diode 402 and trenches 430, or even be positioned directly above the trenches 430, depending on the pattern.

FIG. 4C is an expansion of the portion 450 outlined in FIG. 4B. FIG. 4C illustrates how light emitted from light emitting diode 402 travels through the converter layer 406 and how first regions 407 and second region 409 improve the uniformity of light emitted from the array 400. The light emitting diodes 402 emit light into the converter layer 406, as shown by the large arrows 480 crossing the light emitting surface 412 of the light emitting diode 402. The converter material in the converter layer then converts that light, or portion of light, into a different color or combination of colors. For example, a blue light emitted from the light emitting diode 402 may be converter by a combination of yellow and red phosphor materials in converter layer 406 into a light that appears white. Light that has a path through the converter layer 406 that is more perpendicular to the light emitting surface 412 is less converted (such as light represented by arrow 482 and marked CW ray, i.e., cooler white) than light that moves more laterally through the converter layer 406. Light that moves more laterally through the converter layer 406 has a longer optical path through the converter layer 406, and thus may become more converted (such as light represented by arrow 484 marked WW ray, i.e., warmer white as it is more converted due to a longer pathlength through the converter layer). In a homogenous converter layer such as converter layer 306 of array 300 in FIG. 3, this light has a higher probability of being significantly downconverter and causing color over angle and color over source color variations. However, as shown in FIG. 4C, the light that moves laterally through the converter layer 406 encounters the second region 409. The converter in second region 409 of converter layer 406 is different from the converter in first region 407. For instance, the converter in second region 409 may be the same converter material as the converter as in the first region 407, but may have a lower concentration in second region 409 than in first region 407, such that converter light 484 encounters less converter material to converter the light. Alternatively, the converter in the second region 409 may be tuned to compensate for the additional pathlength of ray 484, and for example the converter in second region 409 may be a warmer white or a cooler white, than the converter in first region 407 to adjust the color. For example, if second region 409 has a cooler white converter, a warmer white ray 484 would then encounter the cooler white converter material in region 409, which would adjust the color to match that of ray 482 so that light emitted from the second region 409, represented by arrow 486 matches or is close to the same color as ray 482.

Figure 5:
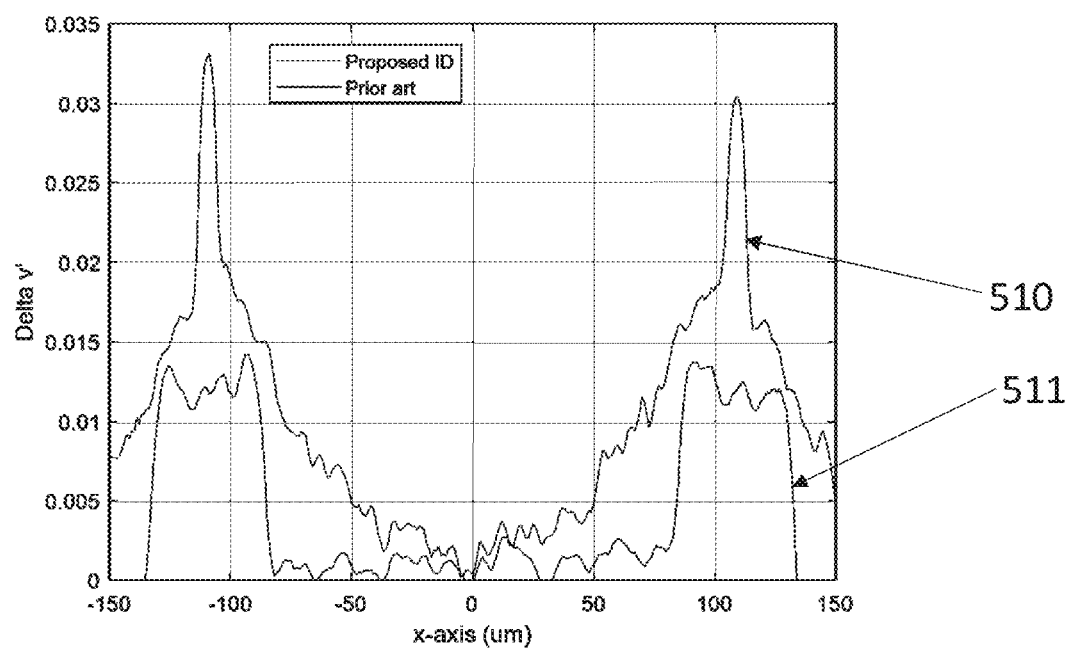
FIG. 5 is a graph showing simulated color over source variation across a pixel comparing a prior art lighting device and a lighting device as disclosed herein.

FIG. 5 is a graph showing simulated color over source variation of a prior art array, plot 510, and for the array 400 disclosed herein, plot 511. The example in FIG. 5 uses a converter layer of 50 µm thickness on a highly compact emitter array of 220 µm×220 µm pixels. The x-axis in FIG. 5 indicates the distance across a light emitting surface of a light emitting diode, with "0" the center point of the light emitting surface. The y-axis in FIG. 5 indicates one of the color coordinates v' of the light emitted from the array at that location. A flatter plot indicates a more uniform color of emitted light. Comparing plot 510 to plot 511, it can be seen that the prior art shows a larger variation in color across the light emitting diode and in particular over the trenches at +/−100 µm.

Light emitting devices having patterned, multicolor converter layers on arrays of individually addressable LEDs can also be used to improve tunable lighting systems.

Lighting devices that provide for a tunable light output, for instance a light output that can be modified between a warmer white light to a cooler white light, are conventionally formed with separate light emitters that provide the two or more different colors of light that are combined in the light output. One problem with the conventional devices is that, in the combined output light, the light from the different colored emitters may still be separately discernable. Use of a multi-converter layer as disclosed herein reduces this problem and improves the light output from a tunable lighting device. In the lighting devices provided herein, the two or more different colors of light are emitted from an array of individually addressable pcLEDs having a patterned converter layer, which array has a small scale, so that the different pixels are not visible to a human without further magnification. For example, each light emitting diode may have a light emitting surface area of 500 µm by 500 µm or less. For instance, for certain flash application the light emitting surface area may be 300 µm by 300 µm. For other application, the light emitting surface area may be 200 µm by 200 µm.

Figure 6A:
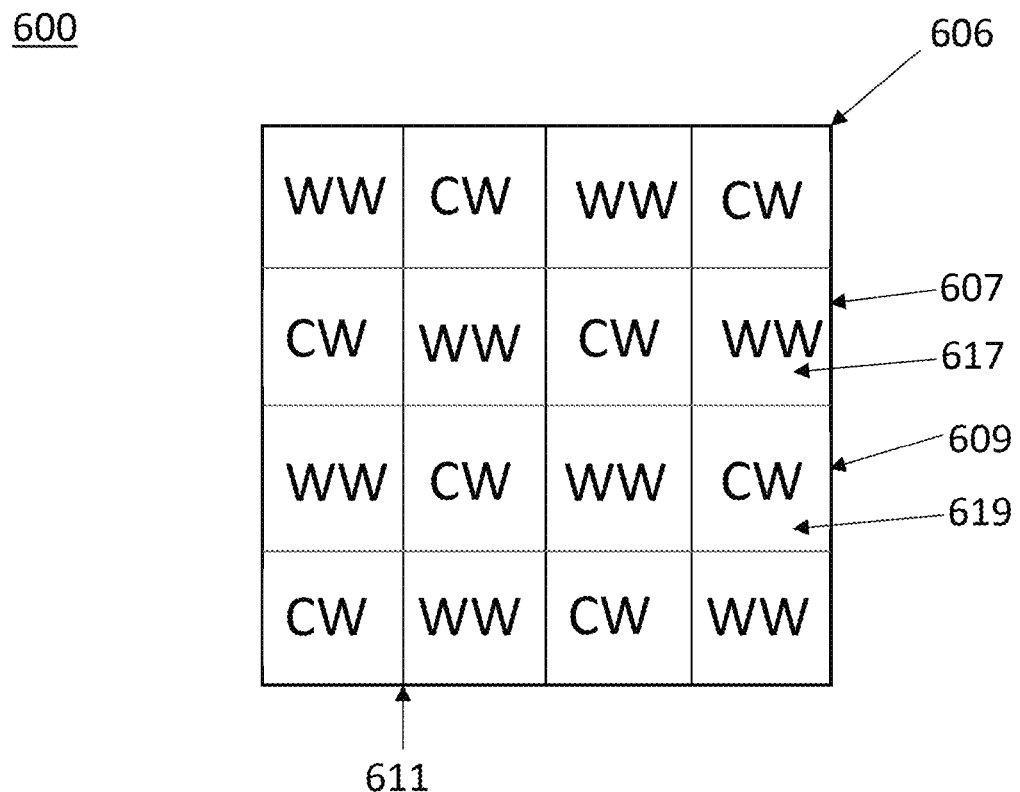
FIGS. 6A and 6B illustrate, respectively, a top schematic and cross-sectional view of an example embodiment of a lighting device having a patterned converter layer over an array of light emitting diode structures for a tunable lighting system as disclosed herein.
Figure 6B:
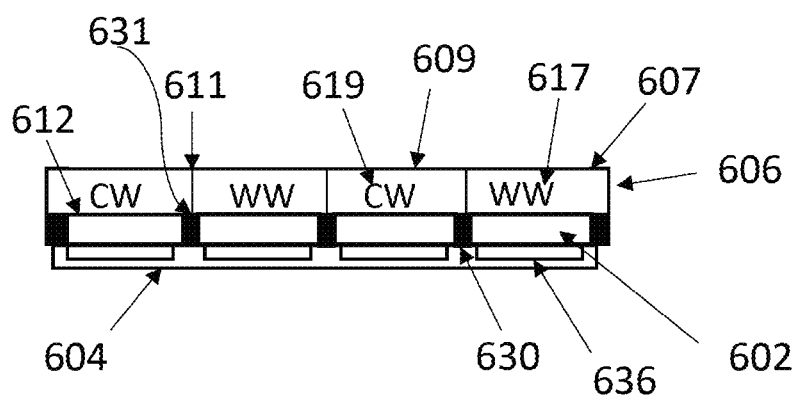

FIGS. 6A and 6B illustrate, respectively, a top and cross-sectional view of another lighting device with a pcLED array and a patterned converter layer using two different converters in a tunable lighting system.

Array 600 of FIGS. 6A and 6B includes a plurality of individual light emitting diode structures 602 and contacts 636 for electrically connecting to each light emitting diode structure 602. Contacts 636 and light emitting diode structures 602 may be situated on a substrate 604. Each light emitting diode 602 is separated by trenches 630. The structure of the light emitting diodes 602, contacts 636 and trenches 630 may be similar to those described with respect to FIG. 2C. In array 600, however, the upper surface 631 of the trenches 630 aligns, or substantially aligns, with the upper surface of the light emitting diodes 602, so the surface is flat, or substantially flat, and there are no optical isolation barriers protruding into converter layer 606.

Converter layer 606 of array 600 is formed with first regions 607 formed with a first converter 617, and second regions 609 formed with a second converter 619 different than the first converter 617. The first converter 617 may result in emission of a warm white light, for instance, first converter 617 may be formed with a phosphor or phosphor combination that emits a warm white light in response to light emitted from a blue LED. The second converter 619 may result in emission of a cool white light, for instance, second converter 619 may be formed with a phosphor or phosphor combination that emits cool white light in response to light emitted from a blue LED.

The first regions 607 and second regions 609 are formed into a checkerboard pattern, with the shape and area of each region corresponding to, and covering, a light emitting surface 612 of a light emitting diode structure 602. In the checkerboard pattern, the first regions 607 and second regions 609 alternate along both rows and columns of the array of light emitting diode structures 602. The first regions 607 and second regions 609 are in the same plane parallel with the light emitting surface 612 and the first converter 617 and second converter 619 meet at junctions 611 which, in this example, are aligned over the trenches 630. Each light emitting diode structure 602 covered with a first region 607 of the converter layer 606 may be referred to herein as a "warm white pixel" or "WW pixel," (indicated as "WW" in FIGS. 6A and 6B), and each light emitting diode structure 602 covered with a second region 609 of the converter layer 606 may be referred to herein as a "cool white pixel" or "CW pixel," (indicated as "CW" in FIGS. 6A and 6B).

Figure 6C:
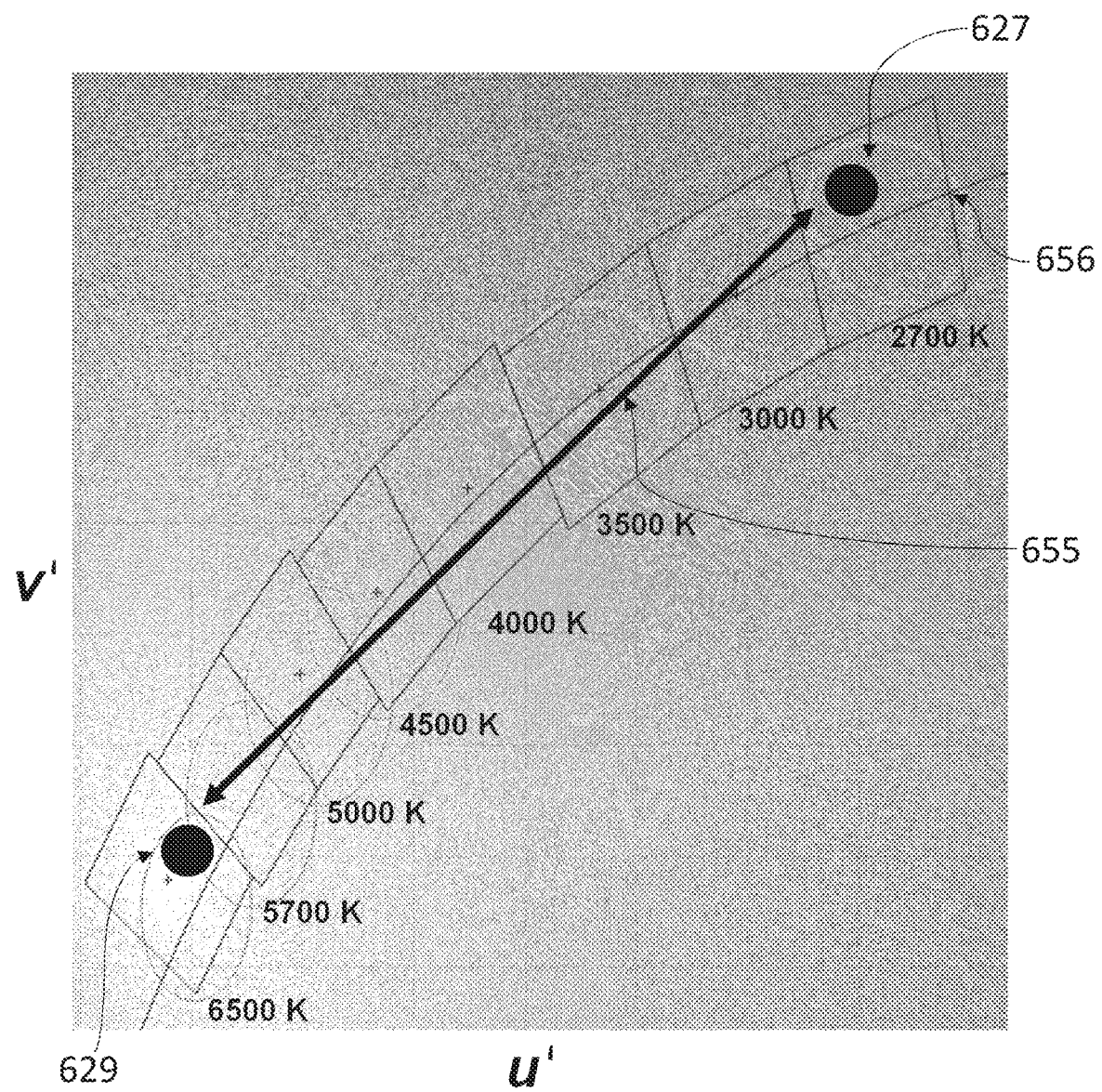
FIG. 6C is a simulation of the tuning range between warm white a cool white in a chromaticity diagram for lighting device such as that shown in FIGS. 6A and 6B.

In array 600, each of the light emitting diodes 602 is individually addressable, and thus a color of light emitted from array 600 can be tuned between the two colors, warm white and cool white, along the black body axis, as shown in FIG. 6C. FIG. 6C is a simulation of the tuning range between warm white a cool white in a chromaticity diagram for array 600. Viewing FIG. 6C, the point 627 represents the CIE 1976 color value of the color emitted by the warm white pixels in array 600 and the point 629 represents the CIE color value of the color emitted by the cool white pixels in array 600. The line 655 indicates the range of color values that array 600 may emit with adjustment of the ratio of light emitted from the warm white and cool white pixels. That is, when the warm white pixels are on and the cool white pixels are off, the color of light emitted from array 600 is indicated by point 627, in this example. When, on the other hand, the cool white pixels are on and the warm white pixels are off, the color of light emitting from array 600 is indicated by point 629 in this example. By adjusting the ratio of light emitted between the warm white pixels and cool white pixels, light emitted from array 600 may have colors along line 655. For reference, curve 656 represent the black body emitter.

Figure 6D:
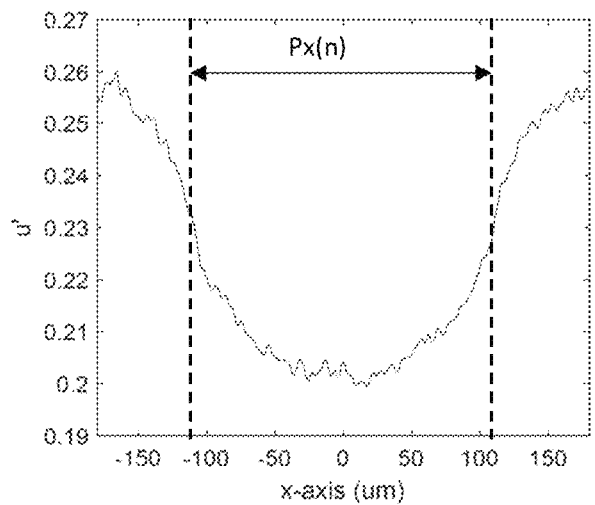
FIGS. 6D and 6E show simulated color point transitions between neighbor pixels in a tunable lighting device such as that shown in FIGS. 6A and 6B.
Figure 6E:
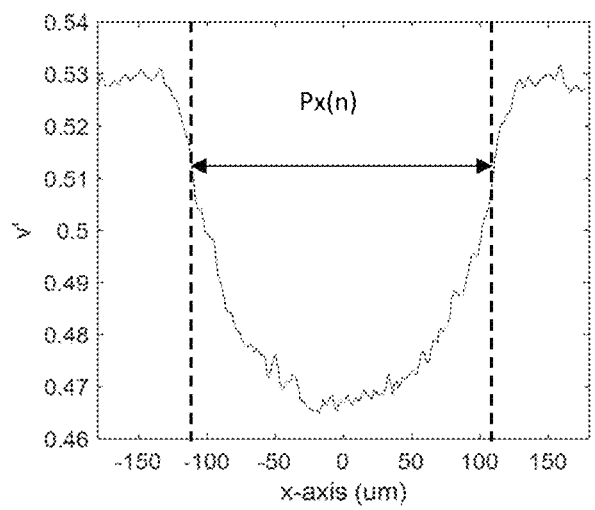

Because the dimensions of the warm white and cool white pixels in array 600 are so small, for example, having light emitting surfaces of 500 µm×500 µm or less, the individual pixel colors are not discernable to a person in light emitted by array 600 (without additional magnification). FIGS. 6D and 6E show simulated color point transitions between neighbor pixels in a 7 pixel×7 pixel array (that is 7×7 pcLEDs), where each pcLED has a light emitting surface with an area of 200 µm×200 µm, and the thickness of the converter layer 606, from the light emitting surface 612 of the light emitting diode 602 to the upper surface of the converter layer 606, measuring perpendicular to the light emitting surface 612, is 60 µm. Simulations were performed using commercial ray tracing software. FIG. 6D shows the value of v' and FIG. 6E the value of u' (CIE 1976) across a warm white pixel Px(n). FIGS. 6D and 6E show there is a color point transition between neighboring pixels in array 600, and that even though there are no optical isolation barriers in converter layer 606, the colors of neighboring pixels can be resolved when using converter layer 606. Thus, there is sufficient light decoupling between neighboring pixel so that independent color control is possible, even though light at the pixel boundaries are partially mixed. To increase uniform illumination, in addition to having sufficiently small pixel dimensions, a top diffuser lens may be used.

Figure 7A:
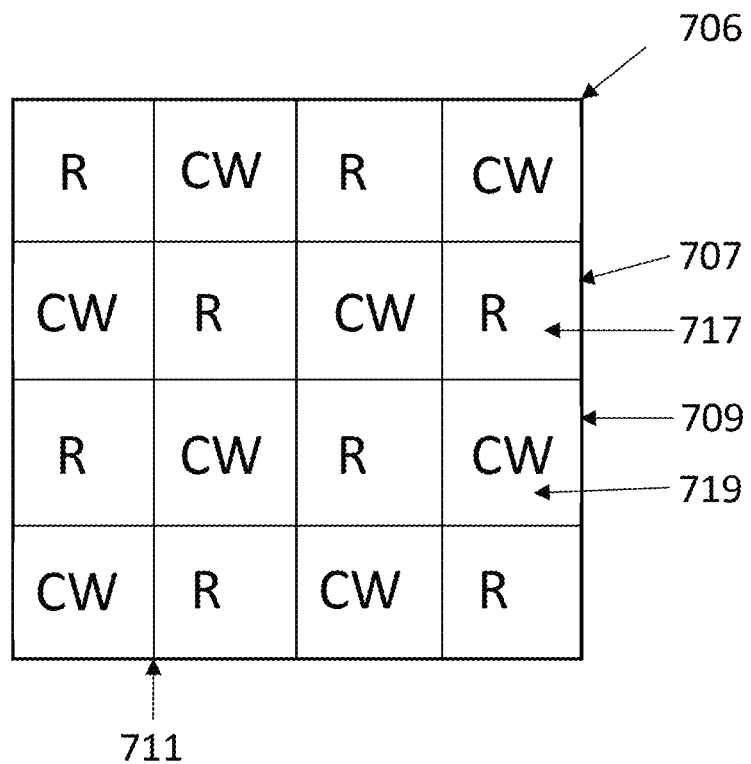
FIGS. 7A and 7B illustrate, respectively, a top schematic and cross-sectional view of another example embodiment of a lighting device having a patterned converter layer over an array of light emitting diode structures for a tunable lighting system.
Figure 7B:
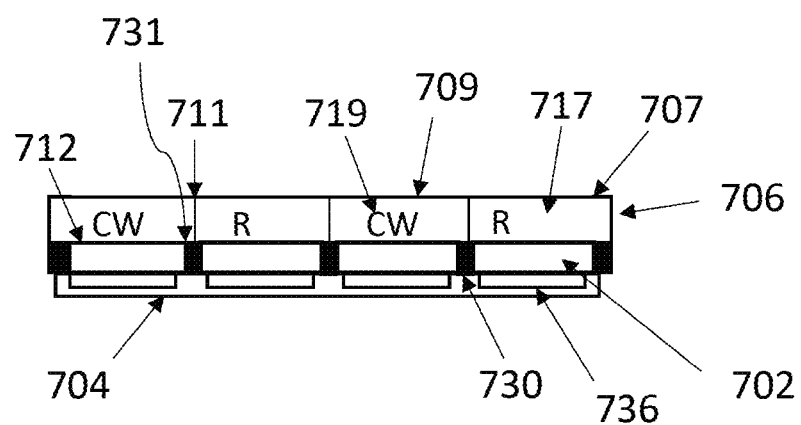

FIGS. 7A and 7B illustrate, respectively, a top and cross-sectional view of another lighting device with a pcLED array and a patterned converter layer using two different converters in a tunable lighting system.

Similar to array 600 disclosed above with respect to FIGS. 6A and 6B, array 700 of FIGS. 7A and 7B includes a plurality of individual light emitting diode structures 702 and contacts 736 for electrically connecting to each light emitting diode structure 702. Contacts 736 and light emitting diode structures 702 may be situated on a substrate 704. Each light emitting diode 702 is separated by trenches 730. The structure of the light emitting diodes 702, contacts 736, and trenches 730 may be similar to those described with respect to FIG. 2C. In array 700, however, the upper surface 731 of the trenches 730 aligns, or substantially aligns, with the upper surface of the light emitting diodes 702, so that the surface is flat, or substantially flat, and there are no optical isolation barriers protruding into converter layer 706.

Converter layer 706 of array 700 is formed with first regions 707 formed with a first converter 717, and second regions 709 formed with a second converter 719 different than the first converter 717. Whereas in array 600 of FIGS. 6A and 6B, the first converter and second converter were phosphors that produce warm white and cool white light, respectively, the two converters in the example array 700 are two different colors. For instance, first converter 717 may result in emission of a red light and may be formed with a phosphor that emits a red light in response to light emitted from a blue LED. The second converter 719 may result in emission of a cool white light, for instance, second converter 719 may be formed with a phosphor material that emits cool white light in response to light emitted from a blue LED. In another example, the first converter 717 may result in emission of infrared (IR) light (having wavelengths, e.g., in the 800 nm to 1000 nm range).

The first regions 707 and second regions 709 are formed into a checkerboard pattern, with the shape and area of each region corresponding to, and covering, a light emitting surface 712 of one of the light emitting diode structures 702. In the checkerboard pattern, the first regions 707 and second regions 709 alternate along both rows and columns of the array of light emitting diode structures 702. The first regions 707 and second regions 709 are in the same plane, parallel to the light emitting surface 712, and the first converter 717 and second converter 719 meet at junctions 711 which, in this example, are aligned over the trenches 730. Each light emitting diode structure 702 covered with a first region 707 of the converter layer 706 may be referred to herein as a "red pixel" (indicated with an "R" in FIGS. 7A and 7B). Each light emitting diode 702 covered with a second region 709 of the converter layer 706 may be referred to herein as a "cool white pixel" or "CW pixel" (indicated with a "CW" in FIGS. 7A and 7B).

In array 700, each of the light emitting diodes 702 is individually addressable and thus independently controllable, and thus a color of light emitted from array 700 can be changed between the two colors. When one set of light emitting diode structures 702, those under the red pixels, are on, and the other set of light emitting diodes 702, those under the cool white pixels, are off, the light emitted from the array 700 is red. Conversely, when the opposite set of the light emitting diodes 702, those under the cool white pixels, are on, and the light emitting diode structures 702 that are under red pixels are off, the light emitted from the array 700 is white. This type of color changing array can be made of more than two colors. Similar to the array 600 disclosed above, the array 700 may also be tuned to colors that are a mix of the red pixels and cool white pixels, or whichever colors that are used, by providing power to the pixels in ratios.

Figure 7C:
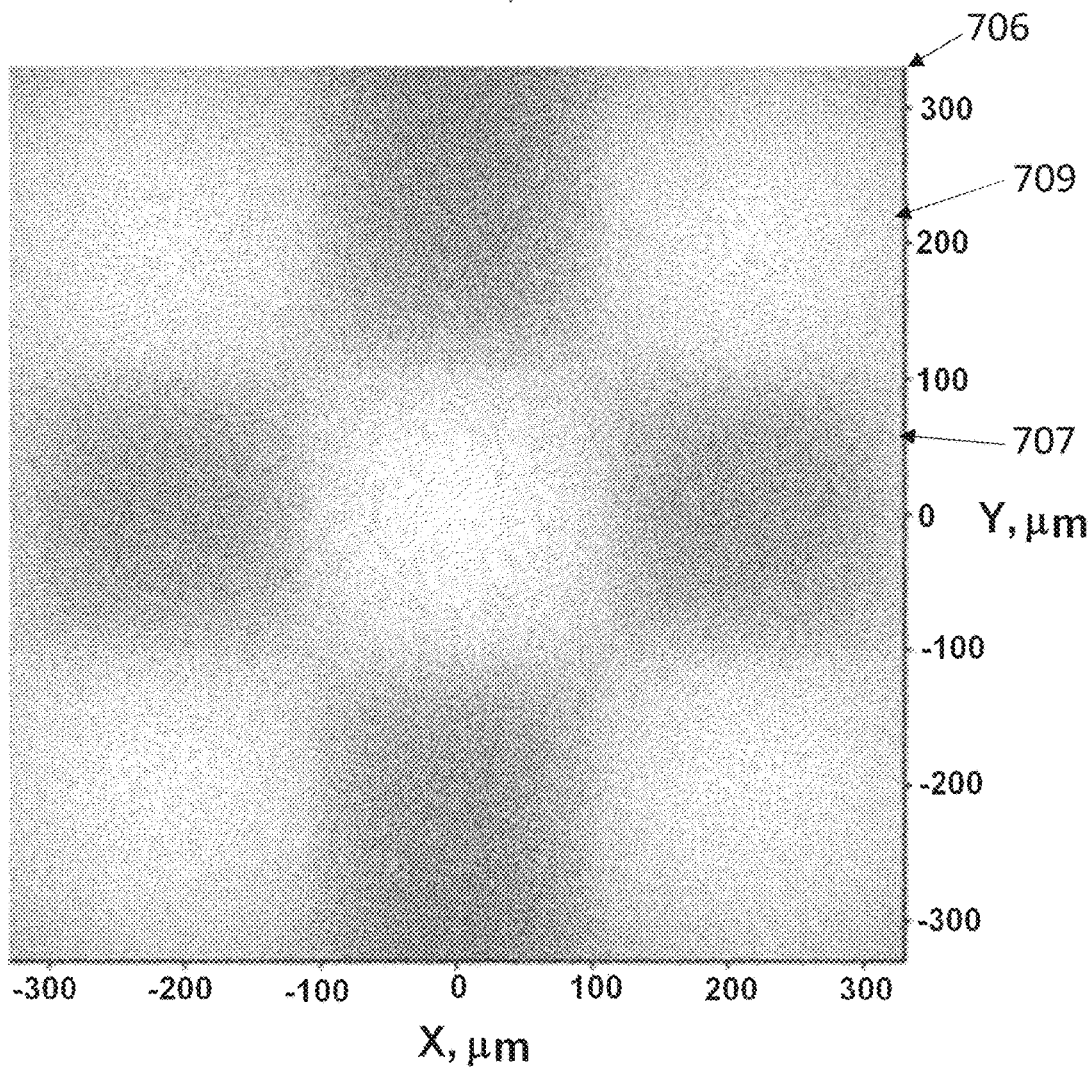
FIG. 7C is a color illuminance simulation of a magnified view of a lighting device such as that shown in FIGS. 7A and 7B.

FIG. 7C is a color illuminance simulation of a magnified view of a 3 pixel by 3 pixel array of 200 µm by 200 µm pixels having a 60 µm thick converter film 706. The converter film 706 has red regions 707 and cool white regions 709 in the checker board pattern as disclosed above. The simulation in FIG. 7C shows that, under a magnified view, there are two distinct converter regions 707 and 709 with the two distinct colors (red and cool white, in this instance). Furthermore, although the converter layer is formed without optical barriers, such as the optical barriers shown in FIGS. 2B and 2C, the method of forming the converter layer 706 with the two different converters in the same plane and meeting at junctions 711 provides optical separation of the different colors of pixels. Because the pixels are too small to be visually distinct, the two colors are not separately distinct.

Figure 7D:
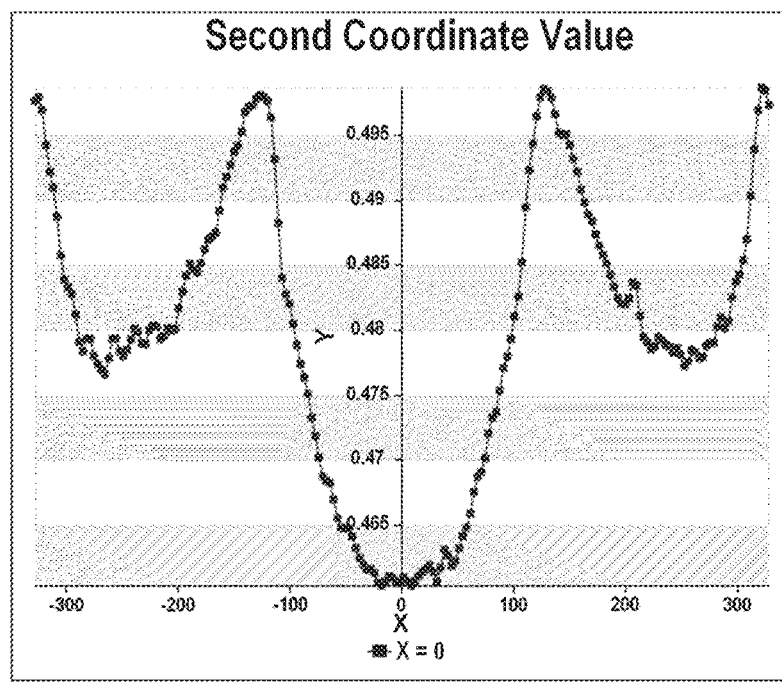
FIGS. 7D and 7E are plots of simulated color points between neighboring pixels of a lighting device such as that shown in FIGS. 7A and 7B.
Figure 7E:
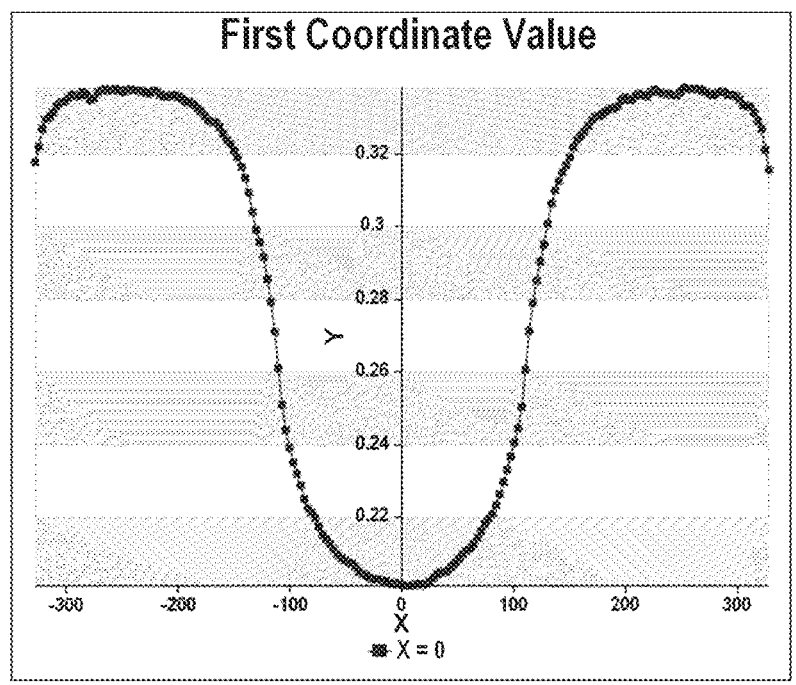

FIGS. 7D and 7E further illustrate the optical separation of the two different converter regions 707, 709 in converter layer 706. FIGS. 7D and 7E are plots of the simulated color points between neighboring pixels on a 7 pixel by 7 pixel pcLED array, with 200 µm by 200 µm pixels, and a 60 µm thick converter layer. The "second coordinate value" of FIG. 7D is u' and the "first coordinate value" of FIG. 7E is v'. FIGS. 7E and 7E therefore depict how color transitions between adjacent pixels and are useful to estimate how much light mixing there is in between pixels. It can be seen that for both the first and second coordinate value, at the junctions (+/−100 µm) there is a relatively abrupt change in the color. Thus, despite not having optical isolations barriers, such as optical isolation barriers 220 shown in FIGS. 2B and 2C, there is enough optical isolation to prevent light propagation into the neighboring pixel. Lighting devices such as those disclosed in FIGS. 7A-7E may be useful for automotive applications or, for example, to project traffic symbols on the road with their corresponding colors. The use of a first converter that emits red light and a second converter that emits infrared light may further aid in night vision and light communication capabilities.

When color contrast between neighboring pixels is not as critical to the application and some light mixing between the two colors emitted by the two converters is acceptable, other architectures for lighting devices and patterns for the converter layer may be used that can help maximize efficiency of the lighting device.

FIGS. 8A-8C and 9A-9C illustrate a lighting devices with improved optical efficiency.

Figure 8A:
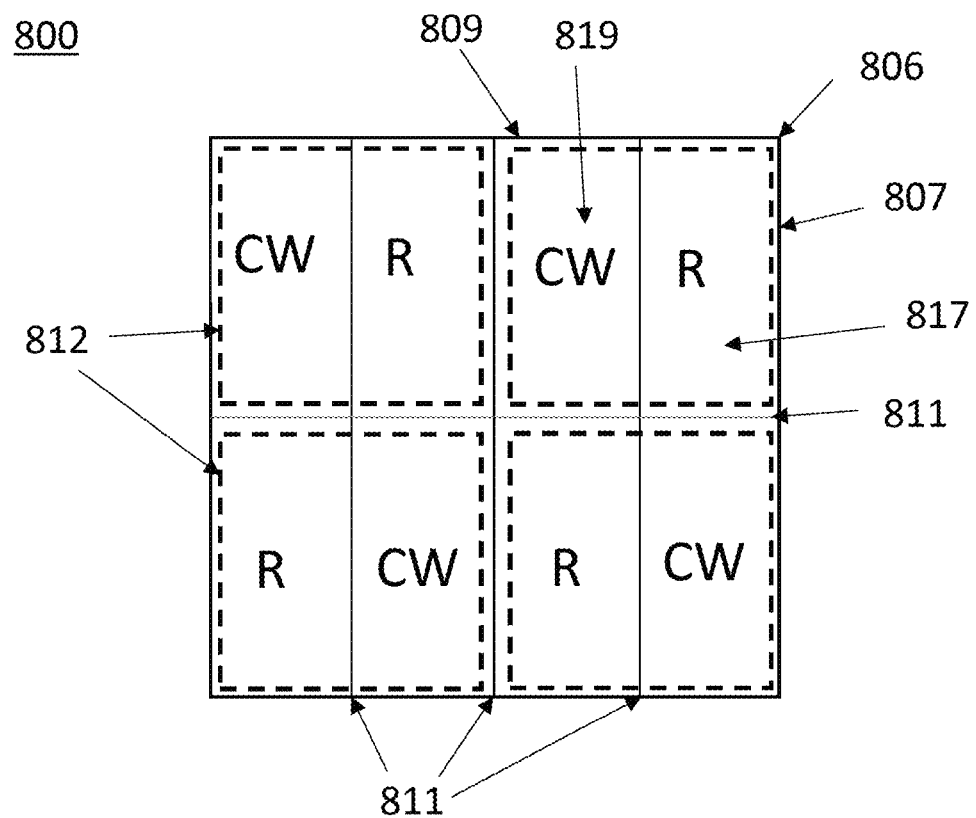
FIGS. 8A and 8B illustrate, respectively, a top schematic and cross-sectional view of an example embodiment of a lighting device having a patterned converter layer and which has a bi-color pixel arrangement.
Figure 8B:
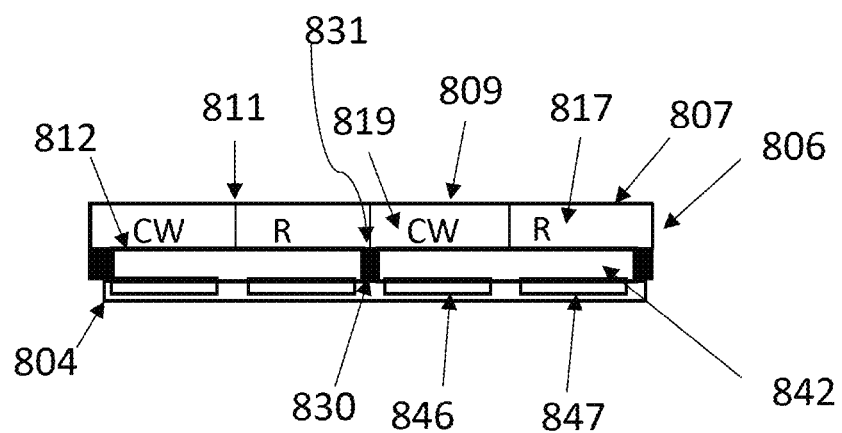

In FIG. 8B, array 800 includes a plurality of individual light emitting diode structures 842. In array 800, however, each light emitting diode has two electrical contacts 846, 847 for electrically connecting to each light emitting diode structure 842. Electrical contacts 846, 847 and light emitting diode 842 may be situated on a substrate 804. Each light emitting diode 842 is separated by trenches 830, which electrically isolated each light emitting diode structure 842 in the array 800. In one example, the structure of light emitting diodes 842, trenches 830, and contacts 846, 847 may be similar to that shown in array 200 of FIG. 2C, except that there are two separate and independent p-contacts electrically connected to each light emitting diode (layers 102a, 102b, and 102c of FIG. 2C). Additionally, the upper surface 831 of the trenches 830 aligns, or substantially aligns, with the upper surface 812 of the light emitting diodes 842, so that the surface is flat, or substantially flat, and there are no optical isolation barriers protruding into converter layer 806.

Converter layer 806 of array 800 is formed with first regions 807 formed with a first converter 817, and second regions 809 formed with a second converter 819 different than the first converter 817. First converter 817 may, for example, result in emission of a red light and may be formed with a phosphor that emits a red light in response to light emitted from a blue LED. The second converter 819 may, for example, result in emission of a cool white light, for instance, second converter 819 may be formed with a phosphor material that emits cool white light in response to light emitted from a blue LED.

The first regions 807 and second regions 809 are formed into a checkerboard pattern and the first regions 807 and second regions 809 are in the same plane in converter layer 806. In the checkerboard pattern, the first regions 807 and second regions 809 alternate along both rows and columns of the array of light emitting diode structures 802. Viewing FIG. 8A, the light emitting surfaces 812 of light emitting diodes 842 underneath the converter layer 806 are indicated with dashed lines. The regions 807, 809 of the converter layer 806 are positioned on the LEDs 842 of array 800 such that each light emitting surface 806 is disposed under two regions, a first region 807 and a second region 809. Thus, in converter layer 806, two separate regions 807, 809 form the shape and area corresponding to, and covering, a light emitting surface 812 of one of the LEDs 842. The first converter 817 and second converter 819 meet at junctions 811. As can be seen in FIG. 8A, portions of the junctions 811 are aligned over the trenches 830 and portions of the junction 811 are over the light emitting surface 812. Each light emitting surface 812 covered with the first region 807 and the second region 809 of the converter layer 806 may be referred to herein as a "bi-color pixel."

Figure 8C:
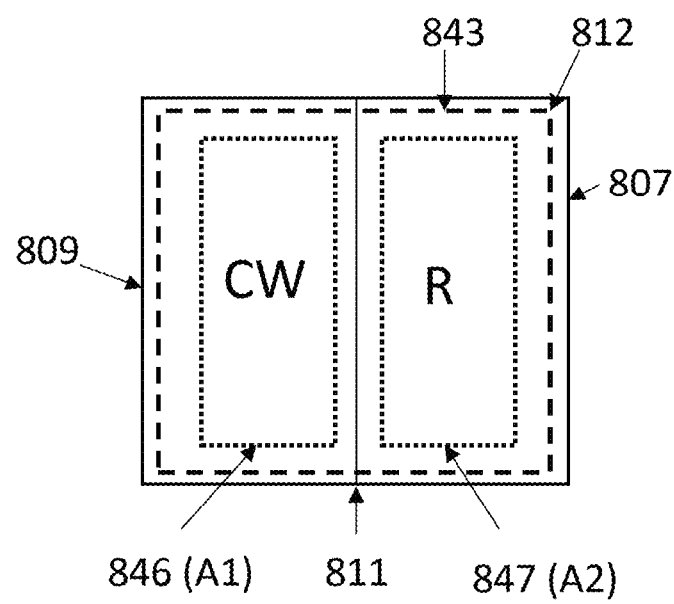
FIG. 8C illustrates a top schematic view of a bi-color pixel of the lighting device shown in FIGS. 8A and 8B showing electrical contacts of the light emitting diode structure.

Each light emitting diode 842, and hence each bi-color pixel, is electrically connected to two independent electrical contacts 846, 847, e.g., two independent anodes, which allow the light emitting diode structure to receive two different current levels. The active layer of each light emitting diode 842 acts as a common cathode for the two independent anodes 846, 847. FIG. 8C is a top view of a single bi-color pixel showing the light emitting surface 812 and common cathode 843 of the light emitting diode, the two electrical connections 846 (also labelled A1) and 847 (also labelled A2) underneath and connected to the common cathode 843 of the light emitting diode, as well as the junctions 811 between first and second regions 807 and 809 of the converter layer 806. Using the two different current levels, a single bi-color pixel can be tuned at a specific color within a certain range in the color space provided by the two converter material 817, 819. More details on driving the bi-color pixels are provided below with respect to FIG. 10.

Figure 9A:
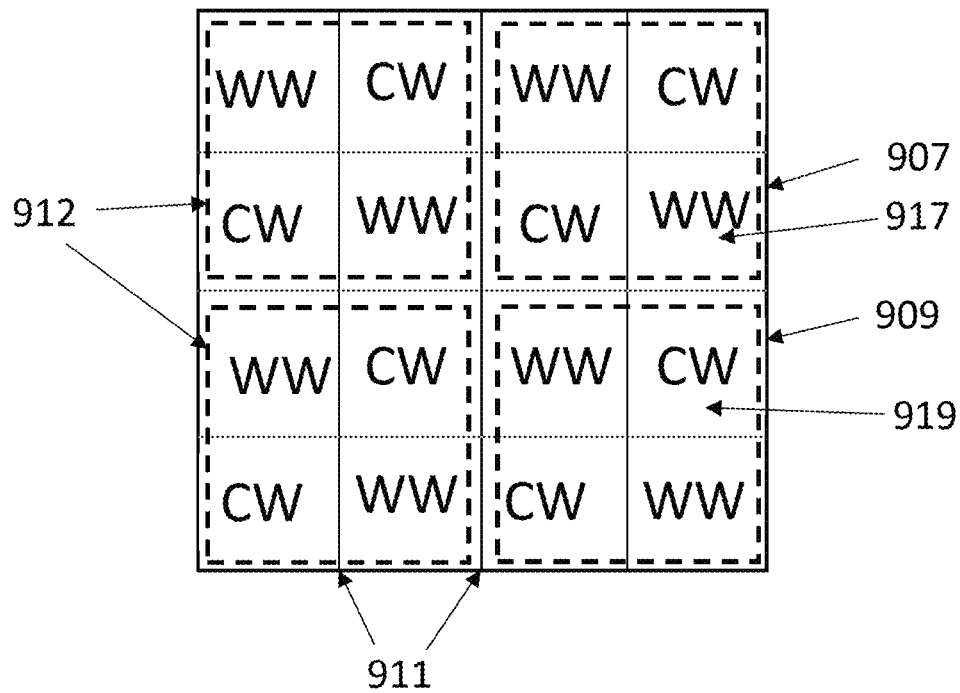
FIGS. 9A and 9B illustrate, respectively, a top schematic and cross-sectional view of another example embodiment of a lighting device having a patterned converter layer and which also has a bi-color pixel arrangement.
Figure 9B:
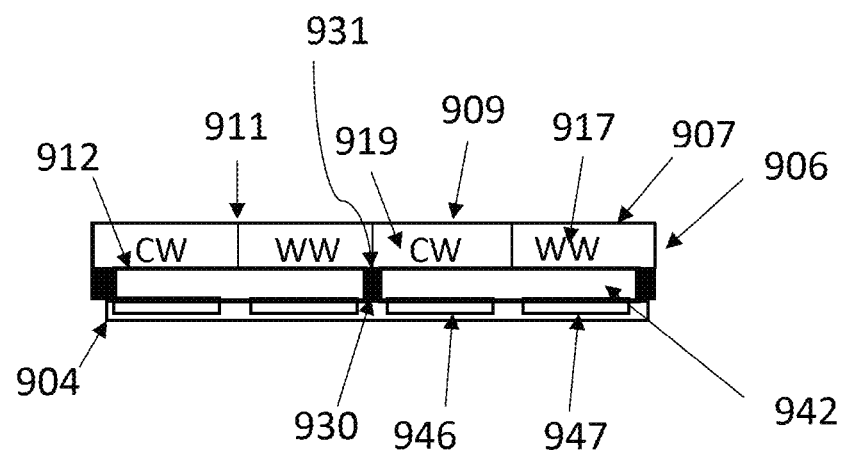

FIGS. 9A and 9B illustrate array 900, which also has a bi-color pixel arrangement, but which has four converter layer regions per pixel. Array 900 is also shown with a converter layer that includes warm white and cool white phosphor.

As in array 800 of FIGS. 8A and 8B, array 900 includes a plurality of individual light emitting diode structures 942 with two independent electrical contacts 946, 947, both of which may be situated on a substrate 904. Trenches 930 separate and electrically isolated each light emitting diode structure 942 in the array 900, with the upper surfaces 930 of the trenches 930 aligning with the light emitting surfaces 912 of the light emitting diode structures 942. There are no optical isolation barriers protruding into converter layer 906.

Converter layer 906 of array 900 is formed with first regions 907 formed with a first converter 917, and second regions 909 formed with a second converter 919 different than the first converter 917. First converter 917 may, for example, result in emission of a warm white and may be formed with a phosphor that emits a warm white light in response to light emitted from a blue LED. The second converter 919 may, for example, result in emission of a cool white light, for instance, second converter 919 may be formed with a phosphor material that emits cool white light in response to light emitted from a blue LED.

The first regions 907 and second regions 909 are formed into a checkerboard pattern and the first regions 907 and second regions 909 are in the same plane in converter layer 906. In the checkerboard pattern, the first regions 907 and second regions 909 alternate along both rows and columns of the array of light emitting diode structures 902. Viewing FIG. 9A, the light emitting surfaces 912 of light emitting diodes 942 underneath the converter layer 906 are indicated with dashed lines. The checkerboard pattern of the converter layer 906 is positioned on the light emitting diode structures 942 of array 900 such that each light emitting surface 912 has four regions total, two first regions 907 and two second region 909. Thus, in converter layer 906, four separate regions form the shape and area corresponding to, and covering, a light emitting surface 912 of one light emitting diode structure 942. Portions of the junction 911 are aligned over the trenches 930 and portions of the junction 911 are over the light emitting surface 944.

Each light emitting surface 912 covered with the two first regions 907 and the two second regions 909 of the converter layer 960 may be referred to herein as a "bi-color pixel," however more than two colors may be used to form the four regions on each pixel, so the pixels may be considered quad-region pixels. In general, such quad-region pixels may be formed with any two, three, or four colors of converters.

Figure 9C:
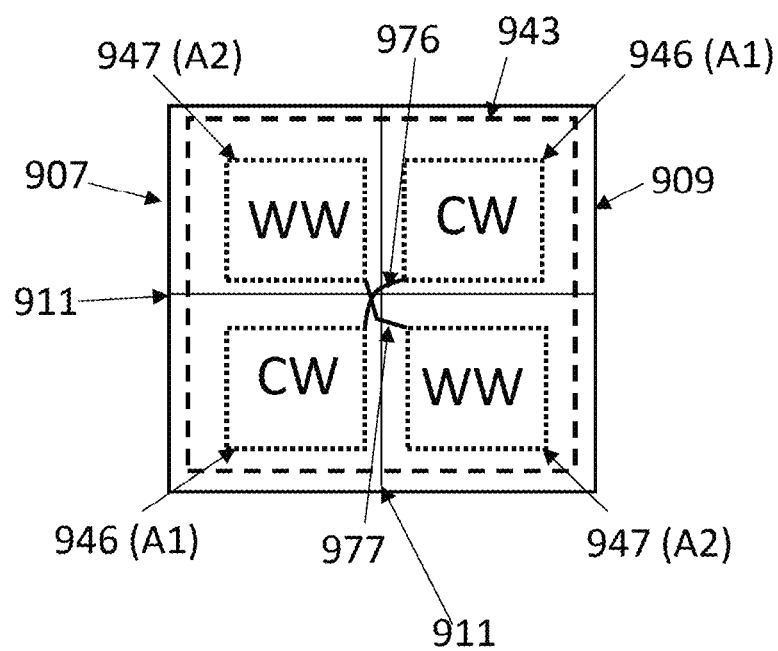
FIG. 9C illustrates a top schematic view of a bi-color pixel of the lighting device shown in FIGS. 9A and 9B showing electrical contacts of the light emitting diode structure.

Similar to array 800, the two independent electrical contacts 946, 947, of array 900 allow the light emitting diode structure to receive two different current levels. The active layer of each light emitting diode 942 acts as a common cathode for the two independent anodes 946, 947. Using the two different current levels, a single bi-color pixel can be tuned at a specific value of white between the warm white and cool white converters. FIG. 9C is a top view of a single bi-color pixel of array 900 showing the light emitting surface 912 and common cathode 943 of the light emitting diode, the two electrical contacts 946 (also labelled A1) and 947 (also labelled A2) underneath and connected to the common cathode 943 of the light emitting diode, as well as the junctions 911 between first and second regions 907 and 909 of the converter layer 906. As shown in FIG. 9C, each electrical contact 946, 947 is divided into two portions that are electrically connected together, as represented by connect 977 connecting the two portions of electrical contact 947 and connect 976 connecting the two portions of electrical contact 946. The two portions of each electrical contact 946, 947 thus provide current to light emitting diode 942 under the two regions which each have the same color. That is, electrical contact 946 provides current for the light emitting diode 942 to emit light into the two cool white regions 909, and electrical contact 947 provides current for light emitting diode 942 to emit light into the two warm white regions 907.

Using the two different current levels, a single quad-region, bi-color pixel can be tuned at a specific color within a certain range in the color space provided by the two converters 917, 919, for example, from a cool white color to a warm white color. It should be noted that the bi-color pixels of array 800 and 900 may be formed with any combination of two converters, and that the concept may be expanded to include three or more colors and a corresponding three or more independent electrodes per light emitting diode. More details on driving the bi-color pixels are provided below with respect to FIG. 10.

This bi-color pixel arrangement reduces the contrast between the pixels but optical efficiency can be significantly improved.

Figure 10:
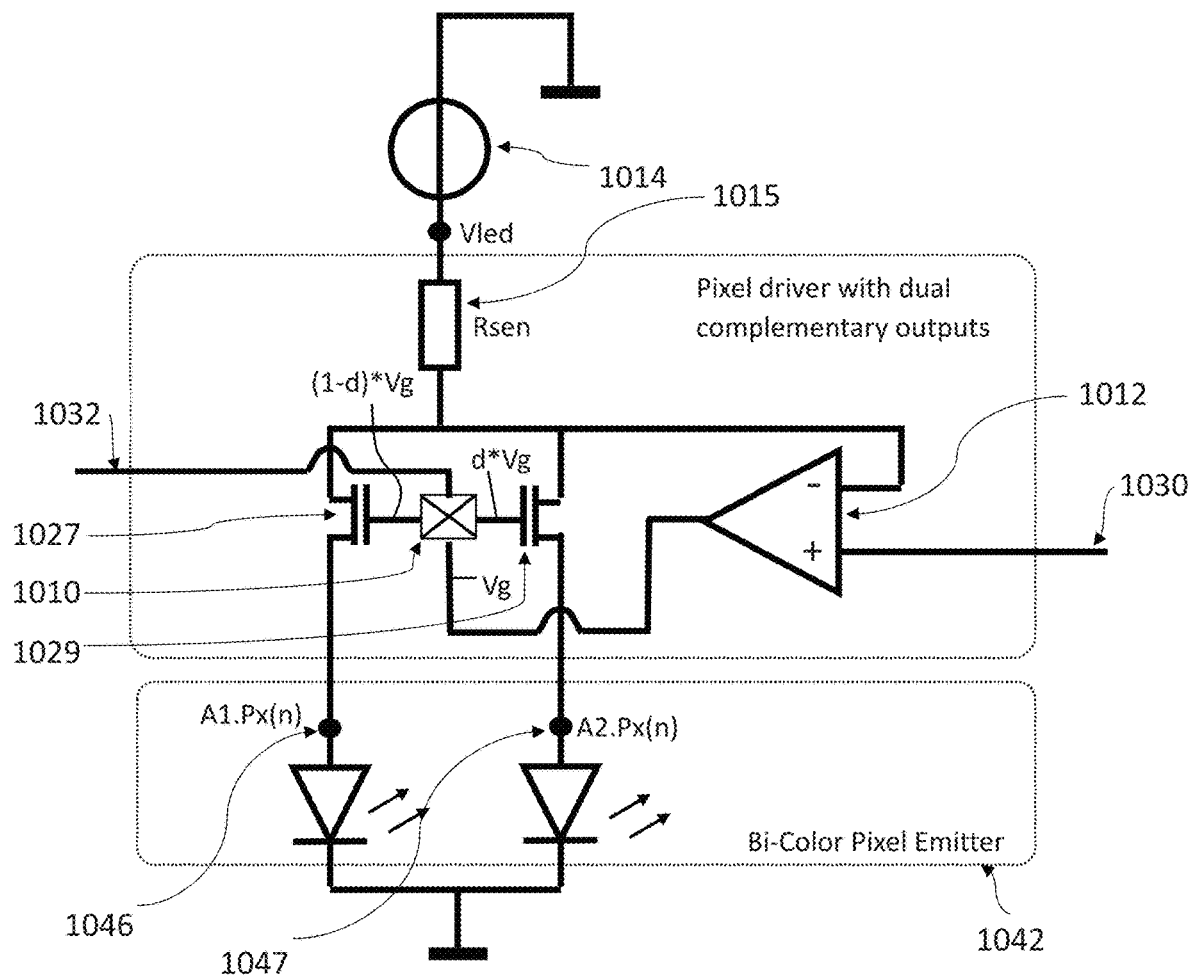
FIG. 10 illustrates a circuit diagram of a complementary dual output pixel driver circuit for use in lighting devices as disclosed herein.

FIG. 10 illustrates a complementary dual output pixel driver circuit 1000 for use with arrays 800 or 900 (and also array 1100 of FIG. 11 below). Each bi-color pixel is driven by its own driver circuit 1000, and may be regarded as a single pixel driven by a common drive current and a control signal to establish the target color. As shown above in FIGS. 8B, 8C, 9B, and 9C, each light emitting diode 842, 942 has two electrical contacts 846, 847, and 946, 947, which electrodes are indicated as A1.Px(n) 1046 and A2.Px(n) 1047 respectively in FIG. 10. As the light emitting diode 842, 942 can be enabled with two independent electrodes, the different regions of the converter layers 806, 906 can be excited with different levels of current applied to the light emitting diode in the different regions. Thus, a single pixel can be tuned to a specific color within the range of color space provided by the first converter and second converter.

In driver circuit 1000, a small signal analog multiplier 1010 is connected to a first capacitor 1027 and a second capacitor 1029. Each capacitor is directly connected to one of the two electrical contacts of a light emitting diode. That is, first capacitor 1027 is directly connected to electrical contact 1046 and second capacitor 1029 is directly connected to electrical contact 1047 of bi-color pixel light emitting diode 1042. First and second electrical contacts 1046, 1047 may be, for example, electrical contacts 846, 847 of a light emitting diode 802 in array 800, or electrical contacts 946, 947 of a light emitting diode 902 in array 900. Multiplier 1010 is connected to and receives voltage Vg from amplifier 1012. Amplifier 1012 is connected to and receives power from power supply 1014 through resistor 1015 (Rsen).

Driver circuit 1000 has two inputs. A first input 1030 allows the user to input Vref which controls the amount of drive power delivered to the light emitting diode 1002. That is, first input 1030 is input through amplifier 1012 to provide multiplier 1010 with Vg. A second input 1032, color control d, determines which of the two anodes receives the power. Second input 1020 sets the duty cycle d. In multiplier 1010, Vg is multiplies by the duty cycles d to determines how much current goes through to one electrical contact 1046 or the other electrical contact 1047. If d=0, all of the power flows through to A2 and to electrode 1046, resulting in light being emitted from the light emitting diode to a first region of the converter layer and light having the color as set by first converter. If d=1, all of the power flows through A1 and to electrode 1046, resulting in light being emitted from the light emitting diode to the second region of the converter layer and light having the color as set by the second converter. If d is set to a value between 0 and 1, the amount of power sent to the first and second electrodes is set proportionally, resulting in the mixing of light emitted by first converter and second converter in proportion to the amount of power provided the respective electrode. That is, multiplier 1010 is employed to balance out the set drive current through each light emitting diode such that I(led.color1(1046))=d*ldrv and I(led.color2(1047))=(1−d)*ldrv, where ldrv is the set drive current of the current source and d may vary between 0 and 1. This allows for a tuning function and control over the color point of the bi-color pixel. This allows control of both the power and the color point. This arrangement con significantly simplify the complexity of the drive and/or reduce component count and/or increase driver efficiency.

A patterned converter layer that improves uniformity of light emitted from an array can also be used with a bi-pixel type arrangement. FIGS. 11A-11D illustrate array 1100 with a patterned converter layer and pixel arrangement that can emit light with improved color uniformity and reduced dark-gap artefacts. Array 1100 also uses a bi-color pixel arrangement similar to array 800 and 900, but with an uneven amount of the two converters. For instance, a warmer white converter that forms 75% of the converter layer and a cooler white converter that forms 25% of the converter layer.

As in arrays 800 and 900, array 1100 includes a plurality of individual light emitting diode structures 1142 with two independent electrical contacts 1146, 1147, both of which may be situated on a substrate 1104. Trenches 1130 separate and electrically isolated each light emitting diode structure 1142 in the array 1100, with the upper surfaces 1131 of the trenches 1130 substantially aligning with the light emitting surfaces 1112 of light emitting diode structures 1142. There are no optical isolation barriers protruding into converter layer 1106.

Converter layer 1106 of array 1100 has first regions 1107 formed with a first converter 1117, and second regions 1109 formed with a second converter 1119 different than the first converter 1117. First converter 1117 may, for example, result in emission of a white light that has a somewhat warmer color and may be formed with a phosphor that emits a warm white light in response to light emitted from a blue LED. The second converter 1119 may, for example, result in emission of a white light that has a somewhat cooler color, for instance, second converter 1119 may be formed with a phosphor material that emits cooler white light in response to light emitted from a blue LED.

The first regions 1107 and second regions 1109 are formed into a grid pattern in which larger areas of the first region 1107 surrounding smaller areas of the second regions 1109. Viewing FIG. 11A, the light emitting surfaces 1112 of light emitting diodes 1142 underneath the converter layer 1106 are indicated with dashed lines. The pattern of first regions 1107 and second regions 1109 is formed so that a portion of each light emitting surface 1112 is covered with portions of both first regions and second regions. In this example, about 75% of the light emitting surface 1112 is covered with first region 1107 of converter layer 1106, and about 25%, one corner, of the light emitting surface 1112 is covered with second region 1109. The converter layer 1106 is formed so that the smaller areas of the second regions 1109 are positioned to cover intersection 1160 where four corners of four adjacent light emitting surfaces 1112 meet. The junctions 1111 of the first regions 1107 and second regions 1109 are positioned over the trenches 1130 and light emitting surfaces 1112 to cross the junctions 1130.

Figure 11A:
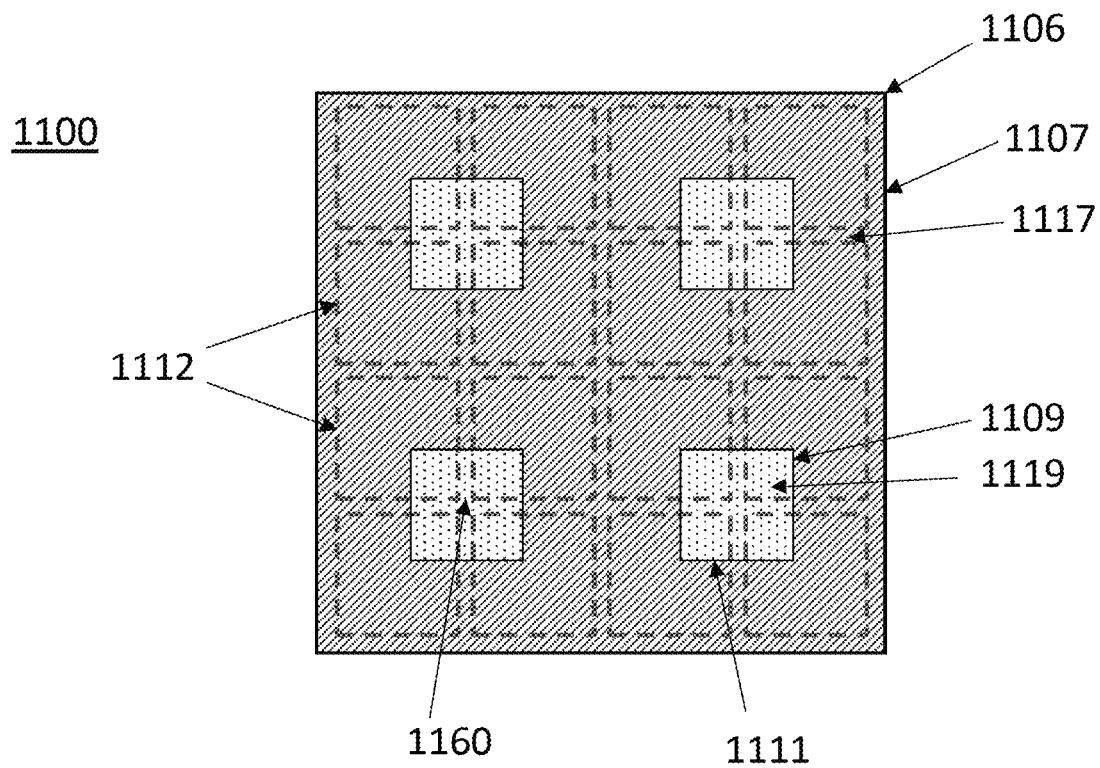
FIGS. 11A and 11B illustrate, respectively, a top schematic and a cross-sectional view of another example embodiment of a lighting device having an array of light emitters and a patterned converter layer.
Figure 11B:
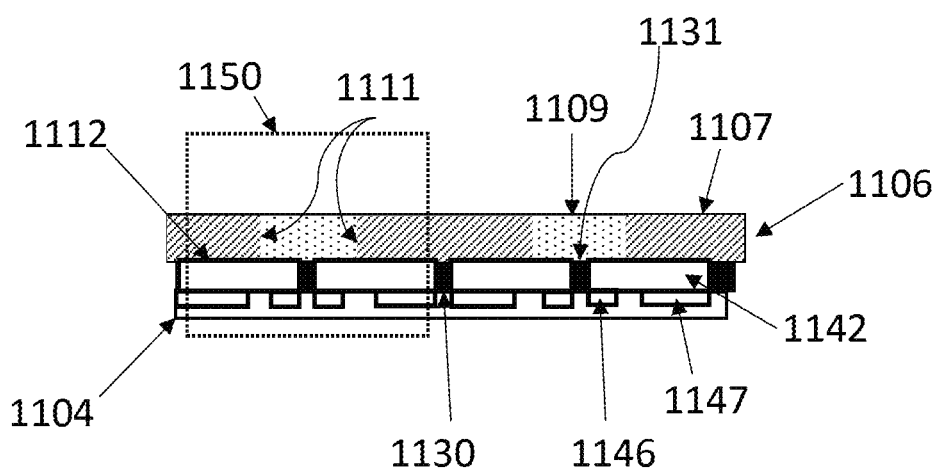
Figure 11C:
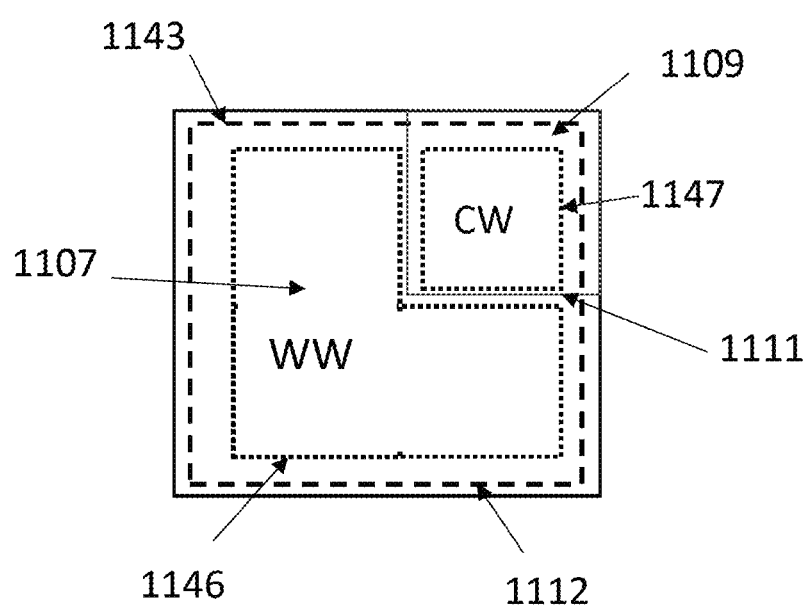
FIG. 11C illustrates a top schematic view of a bi-color pixel of the lighting device shown in FIGS. 11A and 11B showing electrical contacts of the light emitting diode structure.

Similar to arrays 800 and 900, the two independent electrical contacts 1146, 1147, of array 1100 allow the light emitting diode structure to receive two different current levels. Using the two different current levels, a single bi-color pixel can be tuned at a specific value of white between the warm white and cool white converters. FIG. 11C is a top view of a single bi-color pixel of array 1100 showing the light emitting surface 1112 and common cathode 1143 of the light emitting diode, the two electrical contacts 1146 and 1147 underneath and connected to the light emitting diode, as well as the portion of the junction 1111 between first and second regions 1107 and 1109 of the converter layer 1106 over the light emitting surface 1112. The two portions of each electrical contact 1146, 1147 provide current to common cathode 1143 of light emitting diode under the first and second regions 1107, 1109, respectively. That is, electrical contact 1146 provides current for the light emitting diode 1142 to emit light into the warmer white region 1107, and electrical contact 1147 provides current for light emitting diode 1142 to emit light into the cooler white region 1109. Using the two different current levels bi-color pixels of array 1100 can be tuned at a specific color within a certain range in the color space provided by the two converter material 1117, 1119 and in particular may be adjusted to provide a more uniform light source. Current may be provided to the bi-color pixels of array 1100 using, for example, the circuit of FIG. 10.

Figure 11D:
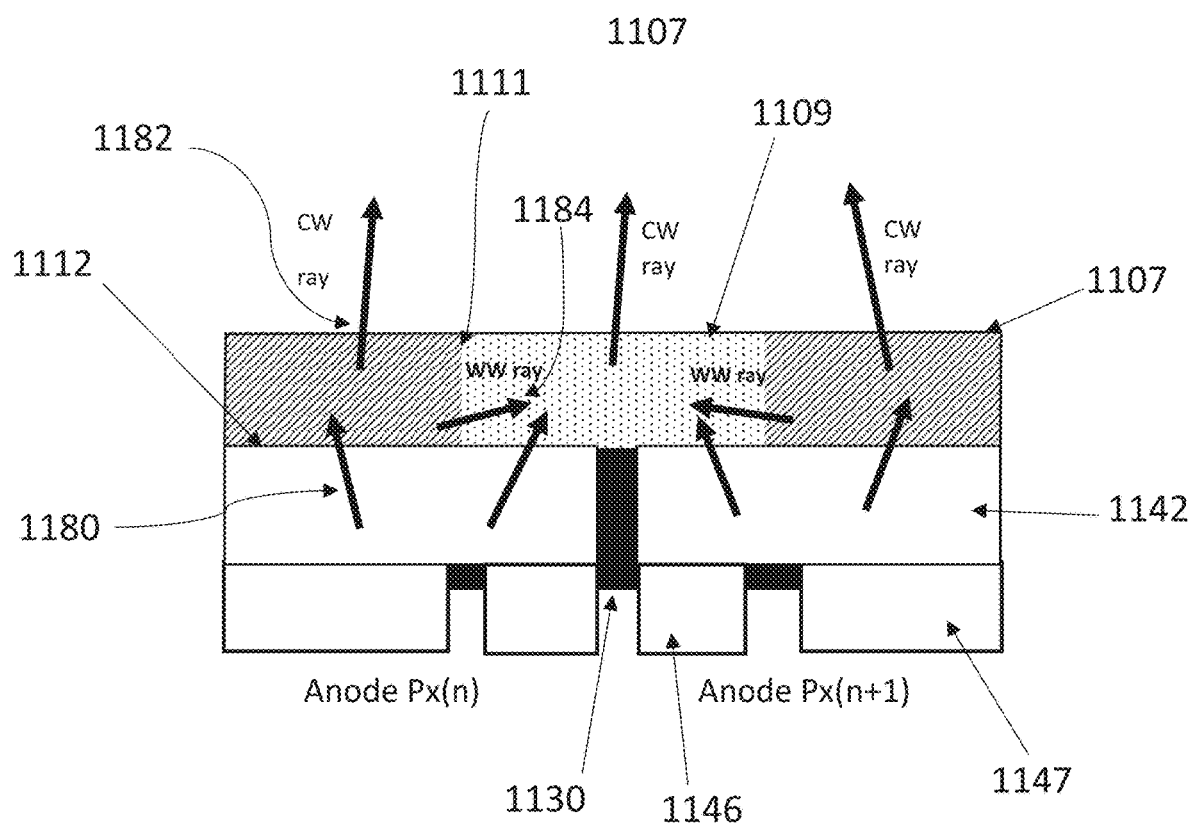
FIG. 11D illustrates an expanded cross-sectional view of a portion of FIG. 11B.

FIG. 11D is an expansion of the portion 1150 outlined in FIG. 11C. FIG. 11D illustrates how light emitted from light emitting diode 1142 travels through the converter layer 1106 and how first regions 1107 and second region 1109 improve the uniformity of light emitted from the array 1100. The light emitting diodes 1142 emit light into the converter layer 1106, as shown by the large arrows 1180 crossing the light emitting surface 1112 of the light emitting diode 1142. The converter material in the converter layer then converts that light, or portion of light, into a different color or combination of colors. For example, a blue light emitted from the light emitting diode 1142 may be converter by a combination of yellow and red phosphor materials in converter layer 1106 into a light that appears white. Light that has a more perpendicular path through the converter layer 1106 is less converted (such as light represented by arrow 1182 and marked CW ray, i.e., cooler white) than light that moves more laterally through the converter layer 1106. Light that moves more laterally through the converter layer 1106 has a longer optical path through the converter layer 1106, and thus may become more converted (such as light represented by arrow 1184 marked WW ray, i.e., warmer white as it is more converted due to a longer pathlength through the converter layer). In a homogenous converter layer such as converter layer 306 of array 300 in FIG. 3, this light has a higher probability of being significantly downconverter and causing color over angle and color over source color variations. However, as shown in FIG. 11D, the light that moves laterally through the converter layer 1106 encounters the second region 1109. The converter in second region 1109 of converter layer 1106 is different from the converter in first region 1107. For instance, the converter in second region 1109 may be the same converter material as the converter as in the first region 1107, but may have a lower concentration in second region 1109 than in first region 1107, such that converter light 1184 encounters less converter material to converter the light. Alternatively, the converter in the second region 1109 may be tuned to compensate for the additional pathlength of ray 1184, and for example the converter in second region 1109 may be a warmer white or a cooler white, than the converter in first region 1107 to adjust the color. For example, if second region 1109 has a cooler white converter, a warmer white ray 1148 would then encounter the cooler white converter material in region 1109, which would adjust the color to match that of ray 1182 so that light emitted from the second region 1109, represented by arrow 1186 matches or is close to the same color as ray 1182. Light emitted from the second region 1109, represented by arrow 1186, is thus also of a cooler white. Furthermore, for each light emitting diode 1142, the amount of light emitted into the first region 1107 and the second region 1109 can be controlled by the two different electrical contacts 1146, 1147 under each region respectively. Thus, by adjusting the ratio of light from the light emitting diode 1142 into each of the two regions 1107, 1109, the uniformity of light emitted by array 1100 can be further improved.

This bi-color pixel arrangement of array 1100 reduces the contrast between the pixels but optical efficiency can be significantly improved. Color mixing improves as the pixel size shrinks, for example, down to the few micron size. Pixel size may be from e.g., from 20-50 µm×20-50 µm down to e.g. 2-5 µm×2-5 µm. The bi-color pixel has improved performance when the pixel size is significantly larger than the size of the converter, for example the phosphor particle size. When a quantum dot is used as the converter, the quantum dots are so small that they could be deposited at a relatively large amount even if the pixel size is just a 2-5 µm by 2-5 µm.

Figure 12:
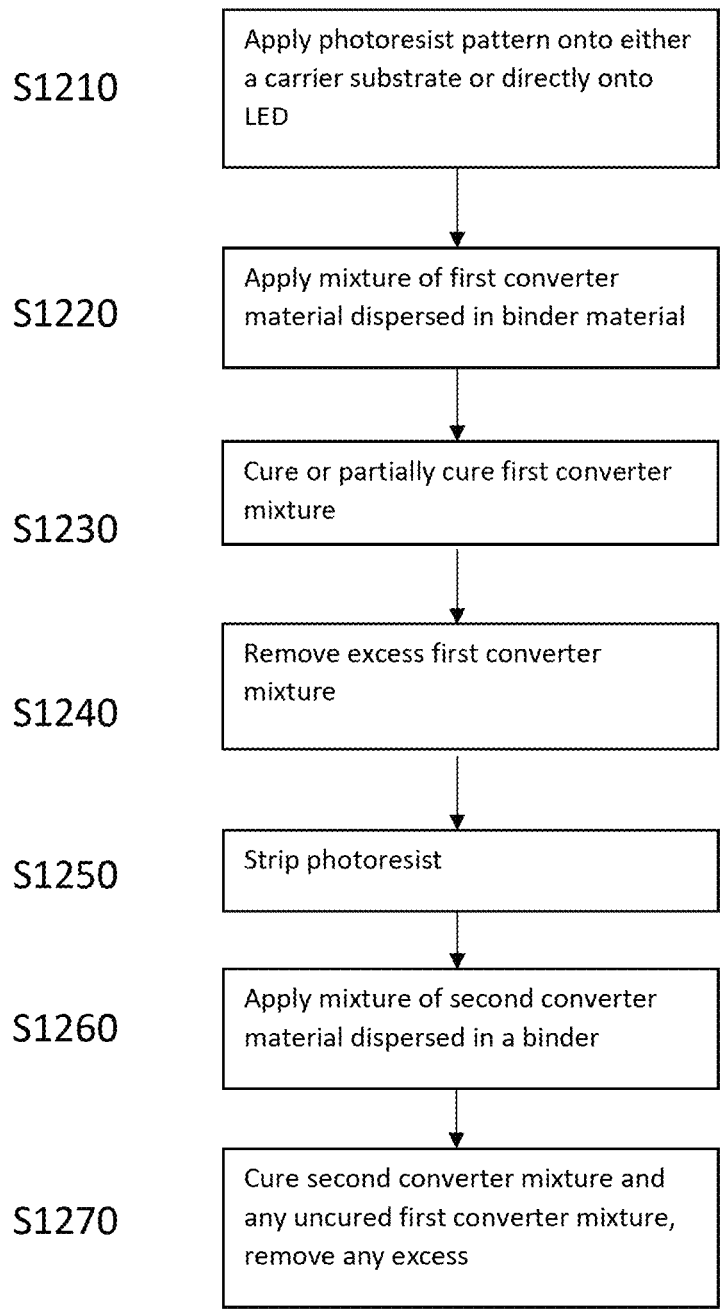
FIG. 12 illustrates a diagram of an example embodiment of a method for forming patterned converter layers such as those disclosed herein.

FIG. 12 illustrates a method for forming a patterned converter layer such as those disclosed herein. At S1210, a photoresist pattern is formed either directly onto the light emitting diode structure or onto a carrier substrate. Either a positive or a negative photoresist may be used, as are understood by persons having ordinary skill in the art. After application and development of the photoresist pattern, a first converter mixture is applied. The first converter mixture may include a first converter material, such as a phosphor, organic dye, or quantum dot, dispersed in a binder, such as a silicone. The first converter mixture may be applied to the photoresist pattern using, for example, blade coating or slot-die coating, which may leave an excess of first converter mixture. At S1230 the first converter mixture is cured or partially cured, and then the excess may be removed (S1240), for example, by a planarization method. The photoresist chosen should be compatible with the curing process for the first converter mixture. At S1250, after removal of the excess first converter material, the photoresist can be stripped, for example, by plasma-ashing, or, in the case of positive photoresists, by wet-chemical stripping. Removing the photoresist leaves gaps in the converter layer around the cured, or partially cured, first converter mixture that will be filled by a second converter. As S1260 a second converter mixture is applied using, for example, blade coating or slot-die coating, which may leave an excess of second converter mixture. The second converter mixture may include a second converter material, such as a phosphor, organic dye, or quantum dot, dispersed in a binder, such as a silicone. After application, the second converter material fills gaps in the converter layer around the cured first converter mixture left by removal of the photoresist. At S1270, the second converter mixture is cured, and, if the first converter mixture was only partially cured at S1230, the curing process of the first converter mixture is completed. Also, if needed, any excess second converter mixture remaining may be removed, for example, by planarization.

This disclosure is illustrative and not limiting. Further modifications will be apparent to one skilled in the art in light of this disclosure and are intended to fall within the scope of the appended claims.

The invention claimed is:

1. A lighting device comprising:
   a plurality of light emitting diodes arranged in an array;
   a plurality of trenches disposed between and optically isolating the light emitting diodes; and a patterned converter layer disposed over an array surface formed by light emitting surfaces of the light emitting diodes and upper surfaces of the trenches, the patterned converter layers comprising a first region having a first converter and a second region having a second converter different from the first converter, the first region disposed over and in contact with one of the light emitting surfaces, and the second region disposed over, in contact with, and covering the entire upper surface of one of the trenches.

2. The light emitting device of claim 1, wherein the first converter is a phosphor that converts light emitted from the light emitting diode structures to a warm white color and the second converter is a phosphor that converts the light emitted from the light emitting diode structures to a cooler white color than the first converter.

3. The light emitting device of claim 1 wherein an area of the first region is smaller than an area of the light emitting surface and the second region covers the trenches and portions of the edges of the light emitting surfaces.

4. The light emitting device of claim 1 wherein the light emitting surfaces have an area that is less than 500 µm by 500 µm, the first converter and second converter are formed in an alternating pattern over each adjacent light emitting surface, and each light emitting diode structure is individually addressable.

5. The light emitting device of claim 4 wherein the first converter emits a warm white light and the second converter emits a cool white.

6. The light emitting device of claim 4, wherein the first converter emits a white light and the second converter emits a colored light.

7. A lighting device comprising:
a plurality of light emitting diodes arranged in an array, each light emitting diode comprising a light emitting surface; and
a patterned converter layer disposed over and in contact with the light emitting surfaces of the light emitting diodes, the patterned converter layers comprising a first region having a first converter and a second region having a second converter different from the first converter, and at least one first region and at least one second region are disposed over each light emitting surface.

8. The lighting device of claim 7, wherein the light emitting diode further comprises a first electrical contact configured to activate light emission from a first portion of the light emitting surface and a second electrical contact configured to activate light emission from a second portion of the light emitting surface.

9. The lighting device of claim 8, wherein the first region of the converter layer is disposed over the first portion of the light emitting surface and the second region of the converter layer is disposed over the second portion of the light emitting surface.

10. The lighting device of claim 8, wherein the first portion is a first half of the light emitting surface and the second portion is a second half of the light emitting surface adjacent to the first half.

11. The lighting device of claim 8, wherein the first portion includes a first quarter of the light emitting surface and a second quarter of the light emitting surface in an opposite corner from the first quarter, and the second portion includes a third quarter of the light emitting surface and a fourth quarter of the light emitting surface in another opposite corner of from the third quarter and adjacent the second quarter.

12. The lighting device of claim 8 further comprising a circuit driver comprising a mixer connected to the first electrical contact and the second electrical contact, the mixer configured to receive an input voltage and an input duty cycle, and to apportion the input voltage between the first electrical contact and the second electrical contact based on the input duty cycle.

13. The lighting device of claim 8 wherein the first converter is a phosphor that converts light emitted from the light emitting diode structures to a warm white color and the second converter is a phosphor that converts the light emitted from the light emitting diode structures to a cooler white color than the first converter.

14. A lighting device comprising:
a plurality of light emitting diodes, each light emitting diode comprising a light emitting surface;
a plurality of first electrical contacts each electrically connected one of the light emitting diodes and configured to activate light emission from a first portion of each of the light emitting diode;
a plurality of second electrical contacts each electrically connected to one of the light emitting diodes and configured to activate light emission from a second portion of each of the light emitting diode; and
a patterned converter layer disposed over the light emitting surfaces of the light emitting diodes, the patterned converter layers comprising a plurality of first regions having a first converter and disposed over the first portions of the light emitting diodes, and a plurality of second regions having a second converter different from the first converter and disposed over the second portion of the light emitting diodes.

15. The lighting device of claim 14, wherein the first portions are ¾ of the light emitting surface of each light emitting diode and second portions are a remaining ¼ of the light emitting surface of each light emitting diode.

16. The lighting device of claim 15, wherein for two adjacent light emitting diodes of the plurality of light emitting diodes, the second portions are adjacent and the second converter regions covers a portion of a trench formed between the two adjacent light emitting diodes.

17. The lighting device of claim 15, wherein for four adjacent light emitting diodes of the plurality of light emitting diodes, the second portions are adjacent and the second converter regions cover a portion of trenches formed between the four adjacent light emitting diodes.

18. The lighting device of claim 14 further comprising a circuit driver comprising a mixer connected to the first electrical contact and the second electrical contact, the mixer configured to receive an input voltage and an input duty cycle, and to apportion the input voltage between the first electrical contact and the second electrical contact based on the input duty cycle.

19. The lighting device of claim 14, wherein the first converter is a phosphor that converts light emitted from the light emitting diode structures to a warm white color and the second converter is a phosphor that converts the light emitted from the light emitting diode structures to a cooler white color than the first converter.

* * * * *